(12) United States Patent
Choi

(10) Patent No.: US 12,484,393 B2
(45) Date of Patent: Nov. 25, 2025

(54) DISPLAY APPARATUS AND METHOD OF MANUFACTURING THE SAME

(71) Applicant: Samsung Display Co., Ltd., Yongin-Si (KR)

(72) Inventor: Chungsock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 746 days.

(21) Appl. No.: 17/579,403

(22) Filed: Jan. 19, 2022

(65) Prior Publication Data

US 2022/0392983 A1    Dec. 8, 2022

(30) Foreign Application Priority Data

Jun. 4, 2021  (KR) .................. 10-2021-0072972

(51) Int. Cl.

| | |
|---|---|
| *H10K 59/131* | (2023.01) |
| *H10K 59/124* | (2023.01) |
| *H10K 59/80* | (2023.01) |
| *H10K 71/00* | (2023.01) |
| *H10K 85/10* | (2023.01) |
| *H10K 102/10* | (2023.01) |

(52) U.S. Cl.
CPC ......... *H10K 59/131* (2023.02); *H10K 59/124* (2023.02); *H10K 85/10* (2023.02); *H10K 59/879* (2023.02); *H10K 71/00* (2023.02); *H10K 2102/101* (2023.02)

(58) Field of Classification Search
None
See application file for complete search history.

(56) References Cited

U.S. PATENT DOCUMENTS

| | | | |
|---|---|---|---|
| 2020/0388789 A1 | 12/2020 | Cha et al. | |
| 2022/0352292 A1* | 11/2022 | Yang | ............. H10K 59/131 |
| 2024/0144873 A1* | 5/2024 | Huang | ............. H10K 59/131 |

FOREIGN PATENT DOCUMENTS

| | | |
|---|---|---|
| CN | 112038373 A | 12/2020 |
| KR | 10-2020-0141553 A | 12/2020 |

OTHER PUBLICATIONS

Lee, C., Seo, J., Shul, Y., & Han, H. (2003). Optical Properties of Polyimide Thin Films. Effect of Chemical Structure and Morphology. Polymer Journal, 35(7), 578-585. https://doi.org/10.1295/polymj.35.578 (Year: 2003).*

* cited by examiner

*Primary Examiner* — Yara B Green
*Assistant Examiner* — Seth D Lawson
(74) *Attorney, Agent, or Firm* — Innovation Counsel LLP

(57) ABSTRACT

A display apparatus includes: a first light emitting device arranged in the first display area; a first pixel circuit electrically connected to the first light emitting device; a second light emitting device arranged in the second display area; a second pixel circuit arranged in the peripheral area and electrically connected to the second light emitting device; an organic insulating layer arranged between the second light emitting device and the second pixel circuit; a connection line which electrically connects the second light emitting device and the second pixel circuit to each other and at least a portion of which is arranged in the second display area; and a phase compensation layer arranged in the second display area to overlap the connection line in a plan view, wherein a refractive index of the phase compensation layer is lower than a refractive index of the organic insulating layer.

14 Claims, 32 Drawing Sheets

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2021-0072972, filed on Jun. 4, 2021, in the Korean Intellectual Property Office, the disclosure of which is incorporated by reference herein in its entirety.

BACKGROUND

1. Field

One or more embodiments relate to a display apparatus and a method of manufacturing the same, and more particularly, to a display apparatus in which a display area is extended such that an image may be displayed even in an area where an electronic component is arranged and a method of manufacturing the display apparatus.

2. Description of the Related Art

Display apparatuses may visually display data. Recently, display apparatuses have, been used for various purposes. As display apparatuses have become thinner and lighter, their range of use has widened.

As a method for extending the area occupied by a display area and simultaneously adding various functions, research has been conducted into a display apparatus for adding functions other than an image display function inside a display area.

SUMMARY

One or more embodiments include a display apparatus capable of displaying an image even in an area where an electronic component is arranged and preventing the performance degradation of the electronic component and a method of manufacturing the display apparatus. However, these problems are merely examples and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus including a first display area, a second display area including a transmission area, and a peripheral area surrounding the first display area and the second display area includes a first light emitting device arranged in the first display area, a first pixel circuit electrically connected to the first light emitting device, a second light emitting device arranged in the second display area, a second pixel circuit arranged in the peripheral area and electrically connected to the second light emitting device, an organic insulating layer arranged between the second light emitting device and the second pixel circuit, a connection line electrically connecting the second light emitting device and the second pixel circuit to each other and at least partially arranged in the second display area, and a phase compensation layer arranged in the second display area to overlap the connection line in a plan view, wherein a refractive index of the phase compensation layer is lower than a refractive index of the organic insulating layer.

According to the present embodiments, the phase compensation layer may be disposed under the connection line.

According to the present embodiments, the phase compensation layer may be disposed over the connection line.

According to the present embodiments, the phase compensation layer may include a lower phase compensation layer disposed under the connection line, and an upper phase compensation layer disposed over the connection line.

According to the present embodiments, the connection line may include a first connection line and a second connection line arranged on different layers with the organic insulating layer disposed therebetween, and the phase compensation layer may include a first phase compensation layer overlapping the first connection line and a second phase compensation layer overlapping the second connection line.

According to the present embodiments, the display apparatus may further include an inorganic insulating layer covering the connection line and the phase compensation layer.

According to the present embodiments, the display apparatus may further include an inorganic insulating layer arranged between the connection line and the phase compensation layer.

According to the present embodiments, a refractive index of the connection line may be higher than the refractive index of the organic insulating layer.

According to the present embodiments, the connection line may include a transparent conductive oxide.

According to the present embodiments, the organic insulating layer may include a photosensitive polyimide or a siloxane-based organic material.

According to the present embodiments, the phase compensation layer may include an inorganic insulating material.

According to the present embodiments, the phase compensation layer may include at least one of silicon oxide ($SiO_2$), silicon oxynitride (SiON), and silicon carbonitride (SiCN).

According to the present embodiments, a thickness of the phase compensation layer may be provided such that a light passing through an area of the second display area in which the connection line is arranged and a light passing through an area thereof in which the connection line is not arranged may have a same phase.

According to one or more embodiments, a display apparatus including a first display area, a second display area including a transmission area, and a peripheral area surrounding the first display area and the second display area includes a first light emitting device arranged in the first display area, a first pixel circuit electrically connected to the first light emitting device, a second light emitting device arranged in the second display area, a second pixel circuit arranged in the peripheral area and electrically connected to the second light emitting device, an organic insulating layer arranged between the second light emitting device and the second pixel circuit, a connection line electrically connecting the second light emitting device and the second pixel circuit to each other and at least partially arranged in the second display area, and a phase compensation layer arranged in the second display area not to overlap a center of the connection line in a plan view, wherein a refractive index of the phase compensation layer is higher than a refractive index of the organic insulating layer.

According to the present embodiments, the phase compensation layer may be arranged on a same layer as the connection line.

According to the present embodiments, the phase compensation layer may be arranged on a layer different than the connection line.

According to the present embodiments, a refractive index of the connection line may be higher than the refractive index of the organic insulating layer.

According to the present embodiments, the connection line may include a transparent conductive oxide.

According to the present embodiments, the organic insulating layer may include a photosensitive polyimide or a siloxane-based organic material.

According to the present embodiments, the phase compensation layer may include an inorganic insulating material.

According to the present embodiments, the phase compensation layer may include at least one of silicon nitride ($SiN_x$) and silicon oxynitride (SiON).

According to the present embodiments, a thickness of the phase compensation layer may be provided such that a light passing through an area of the second display area in which the connection line is arranged and a light passing through an area thereof in which the connection line is not arranged may have a same phase.

According to one or more embodiments, a method of manufacturing a display apparatus including a first display area, a second display area including a transmission area, and a peripheral area surrounding the first display area and the second display area includes forming a phase compensation layer-material layer at least partially arranged in the second display area, forming a connection line-material layer at least partially arranged in the second display area, forming a photoresist pattern layer over the connection line-material layer, forming a connection line by patterning the connection line-material layer by using the photoresist pattern layer as a mask, and forming a phase compensation layer by patterning the phase compensation layer-material layer by using the photoresist pattern layer or the connection line as a mask.

According to one or more embodiments, a display apparatus includes a first display area, a second display area including a transmission area, an intermediate area disposed between the first display area and the second display area, and a peripheral area surrounding the first display area. The display apparatus may include a first light emitting device arranged in the first display area, a first pixel circuit electrically connected to the first light emitting device, a second light emitting device arranged in the second display area, a second pixel circuit arranged in the intermediate area and electrically connected to the second light emitting device, an organic insulating layer arranged between the second light emitting device and the second pixel circuit, a connection line electrically connecting the second light emitting device and the second pixel circuit to each other and at least partially arranged in the second display area, and a phase compensation layer arranged in the second display a overlap the connection line in a plan view. A refractive index of the phase compensation layer may be lower than a refractive index of the organic insulating layer.

Other aspects, features, and advantages other than those described above will become apparent from the following detailed description, the appended claims, and the accompanying drawings.

These general and particular aspects may be implemented by using systems, methods, computer programs, or any combinations of systems, methods, and computer programs.

BRIEF DESCRIPTION OF THE DRAWINGS

The above and other aspects, features, and advantages of certain embodiments of the disclosure will be lore apparent from the following description taken in conjunction with the accompanying drawings, in which.

DETAILED DESCRIPTION

Figure 1:
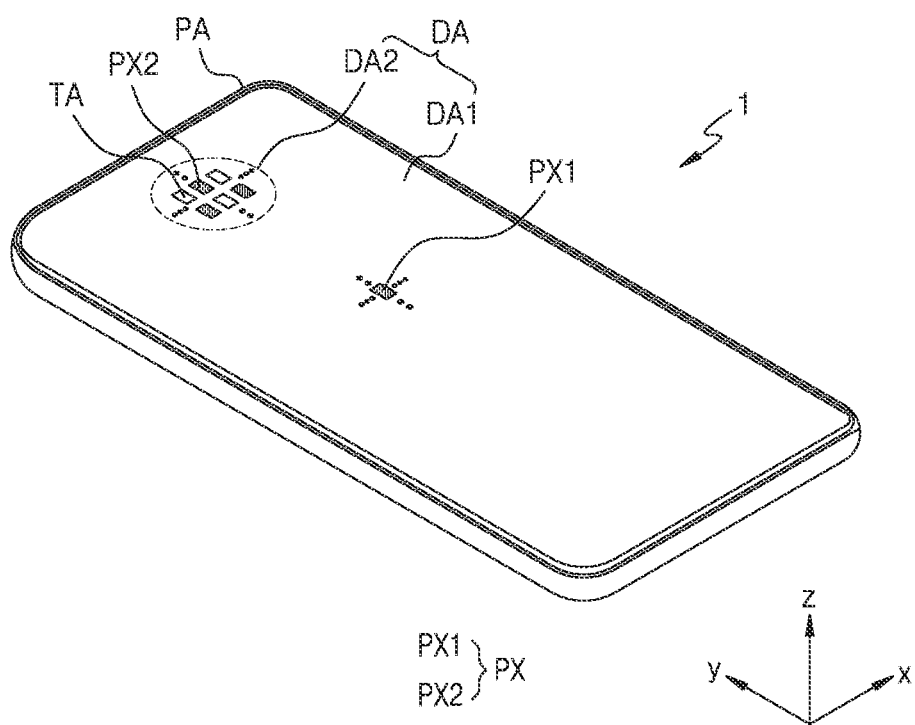
FIG. 1 is a perspective view schematically illustrating an electronic apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not, preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, the disclosure is not limited thereto.

When a certain embodiment may be implemented differently, a particular process order may be performed differently from the described order. For example, two consecutively described processes may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component and/or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a perspective view schematically illustrating an electronic apparatus according to an embodiment.

Referring to FIG. 1, an electronic apparatus 1 may include a display area DA and a peripheral area PA located outside the display area. DA. The display area DA may include a first display area DA1 and a second display area DA2 adjacent to the first display area DA1. The electronic apparatus 1 may display an image through an array of a plurality of pixels PX two-dimensionally arranged in the display area DA. For example, the electronic apparatus 1 may provide a first image by using the light emitted from a plurality of first pixels PX1 arranged in the first display area DA1 and may provide a second image by using the light emitted from a plurality of second pixels PX2 arranged in the second display area DA2. In some embodiments, each of the first image and the second image may be a portion of an image provided through the display area DA of the electronic apparatus 1. Alternatively in some embodiments, the first image and the second image may be provided as images independent of each other.

As an example, FIG. 1 illustrates that one second display area DA2 is located in the first display area DA1. In other embodiments, the display apparatus 1 may include two or more second display areas DA2 and the shapes and sizes of second display areas DA2 may be different from each other. In a view in a direction substantially perpendicular to the upper surface of the display apparatus 1, the second display area DA2 may have various shapes such as circular shapes, elliptical shapes, polygonal shapes such as tetragonal shapes, star shapes, or diamond shapes. In an embodiment, the ratio of the second display area DA2 to the display area DA may be smaller than the ratio of the first display area DA1 to the display area DA.

Although FIG. 1 illustrates that the second display area DA2 is arranged at the upper center (+y direction) of the first display area DA1 having a substantially rectangular shape in a view in a direction substantially perpendicular to the upper surface of the electronic apparatus 1, the second display area DA2 may be arranged, for example, at the upper right side or upper left side of the first display area DA1 having a rectangular shape. Also, as an example, as illustrated in FIG. 1, the second display area DA2 may be arranged inside the first display area DA1 and may be entirely surrounded by the first display area DA1. As another example, the second display area DA2 may be arranged at one side of the first display area DA1 and may be partially surrounded by the first display area DA1. For example, the second display area DA2 may be partially surrounded by the first display area DA1 while being located at a corner portion of the first display area DA1.

An electronic component 40 (see FIG. 2) may be arranged in the second display area DA2. The electronic component 40 may be arranged under a display apparatus 10 (see FIG. 2) to correspond to the second display area DA2.

The electronic component 40 may include an electronic element using light or sound. For example, the electronic element may include a sensor (e.g., as a proximity sensor) for measuring a distance, a sensor for recognizing a portion of a user's body (e.g., a fingerprint, an iris, or a face), a small lamp for outputting light, or an image sensor (e.g., a camera) for capturing an image. In the case of an electronic element using light, the electronic element may use light of various wavelength bands such as visible light, infrared light, and ultraviolet light. The electronic element using sound may use ultrasound or sound of other frequency bands.

In order to allow the electronic component 40 to function smoothly, the second display area DA2 may include a transmission area TA that may transmit light and/or sound output from the electronic component 40 to the outside or propagating toward the electronic component 40 from the outside. The transmission area TA may be an area through which light may be transmitted and may be an area in which a pixel PX is not arranged or an area in which pixel density is lower than the first display area D1. In the case of the electronic apparatus 1 according to an embodiment, when light is transmitted through the second display area DA2 including the transmission area TA, the light transmittance thereof may be about 10% or more, for example, about 25% or more, about 40% or more, about 50% or more, about 85% or more, or about 90% or more.

Because the second display area DA2 includes the transmission area TA, an array of a plurality of first pixels PX1 arranged in the first display area DA1 and an array of a plurality of second pixels PX2 arranged in the second display area DA2 may be different from each other. For example, the transmission area TA may be arranged between adjacent second pixels PX2 among the plurality of second pixels PX2. In this case, the second display area DA2 may have a lower resolution than the first display area DA1. That is, because the second display area DA2 includes the transmission area TA, the number of second pixels PX2 that may be arranged per unit the second display area DA2 may be less than the number of first pixels PX1 arranged per unit area in the first display area DA1. For example, the resolution of the second display area DA2 may be about ½, ⅜, ⅓, ¼, ⅖, ⅛, ⅑, or 1/16 of the resolution of the first display area DA1. For example, the resolution of the first display area DA1 may be about 400 ppi or more, and the resolution of the second display area DA2 may be about 200 ppi or about 100 ppi.

The peripheral area PA may be a non-display area that does not display an image and may entirely or partially surround the display area DA. For example, the peripheral area PA may entirely or partially surround the first display area DA1 and/or the second display area DA2. A driver or the like for providing an electrical signal or power to the display area DA may be arranged in the peripheral area PA. The peripheral area PA may include a pad area that is an area to which an electronic device, a printed circuit board, or the like may be electrically connected.

Moreover, for convenience of description, a case where the electronic apparatus 1 is used in a smart phone will be described below; however, the electronic apparatus 1 of the disclosure is not limited thereto. The electronic apparatus 1 may be applied to various products such as televisions, notebook computers, monitors, billboards, and Internet of Things (IoT) as well as portable electronic apparatuses such as mobile phones, smart phones, tablet personal computers (PCs), mobile communication terminals, electronic notebooks, electronic books, portable multimedia players (PMPs), navigation, and Ultra Mobile PCs (UMPCs). Also, the electronic apparatus 1 according to an embodiment may be applied to wearable devices such as smart watches, watch phones, glasses-type displays, and head-mounted displays (HMDs). Also, the electronic apparatus 1 according to an embodiment may be applied to a center information display (CID) located at a vehicle's instrument panel or a vehicle's center fascia or dashboard, a room mirror display replacing a vehicle's side mirror, or a display screen located at a rear side of a vehicle's front seat as an entertainment for a vehicle's rear seat.

Hereinafter, the display apparatus 1 will be described as including an organic light emitting diode OLED as a light emitting device; however, the display apparatus 1 of the disclosure is not limited thereto. In other embodiments, the display apparatus 1 may include a light emitting display apparatus including an inorganic light emitting diode, that is, an inorganic light emitting display apparatus. In other embodiments, the display apparatus 1 may include a quantum dot light emitting display apparatus.

Figure 2:
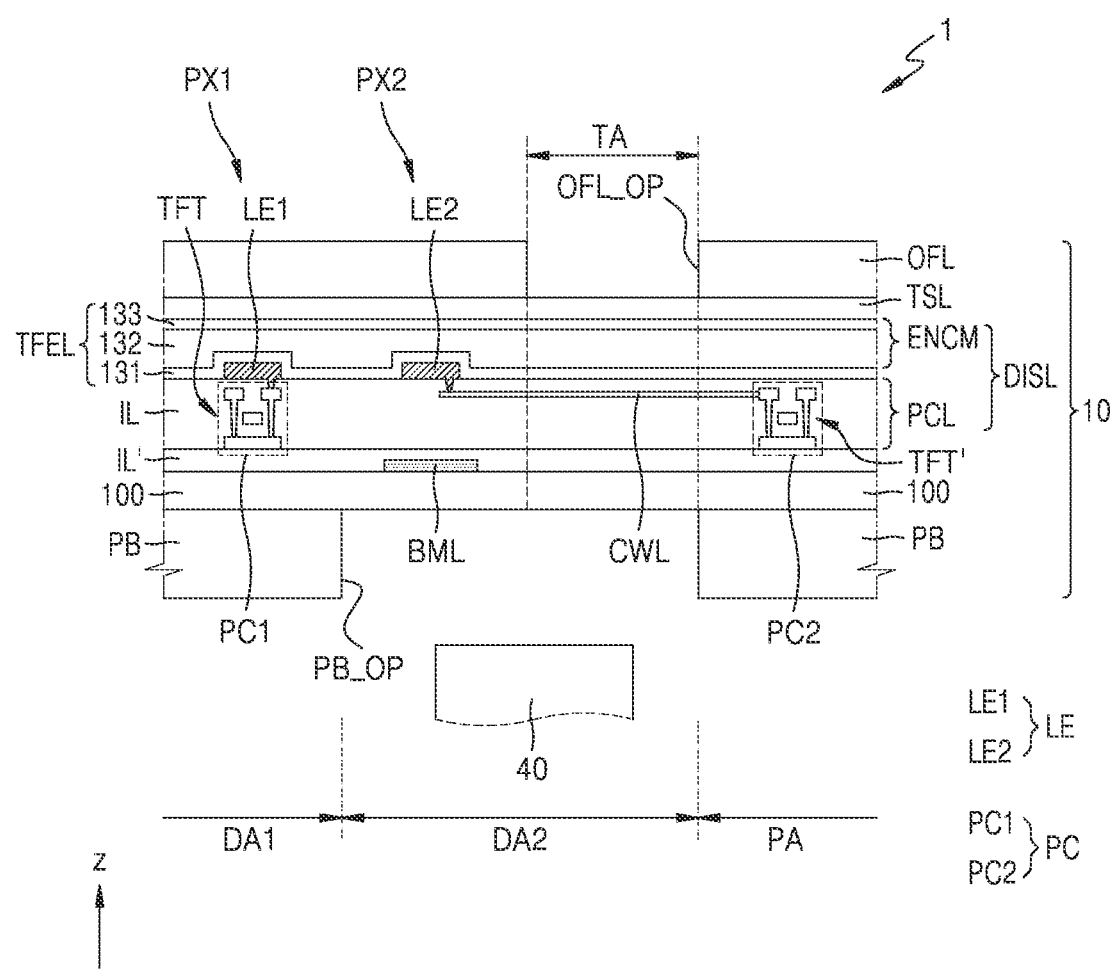
FIG. 2 is a cross-sectional view schematically illustrating a portion of an electronic apparatus according to an embodiment.

FIG. 2 is a cross-sectional view schematically illustrating a portion of an electronic apparatus according to an embodiment.

Referring to FIG. 2, an electronic apparatus 1 may include a display apparatus 10 and an electronic component 40 arranged to overlap the display apparatus 10. A cover window (not illustrated) for protecting the display apparatus 10 may be further arranged over the display apparatus 10.

The display apparatus 10 may include a first display area DA1 displaying a first image and a second display area DA2 displaying a second image and overlapping the electronic component 40. The display apparatus 10 may include a substrate 100, a display layer DISL over the substrate 100, a touch screen layer TSL, an optical functional layer OFL, and a panel protection layer PB arranged under the substrate 100.

The display layer DISL may include a pixel circuit layer PCL including a pixel circuit PC, a light emitting device layer including a light emitting device LE, and an encapsulation layer ENCM. For example, the encapsulation layer ENCM may be a thin film encapsulation layer TFEL or an encapsulation substrate (not illustrated). Insulating layers IL and IL' may be arranged in the display layer DISL and between the substrate 100 and the display layer DISL.

The substrate 100 may include an insulating material such as glass, quartz, or polymer resin. The substrate 100 may include a rigid substrate or a flexible substrate capable of bending, folding, rolling, or the like.

A plurality of first pixel circuits PC1 and a plurality of first light emitting devices LE1 respectively electrically connected to the plurality of first pixel circuits PC1 may be arranged in the first display area DA1 of the display apparatus 10. The first pixel circuit PC1 may include at least one thin film transistor TFT and may control light emission of the first light emitting device LE1. The first light emitting device LE1 may emit light through an emission area, and a first pixel PX1 may include the emission area. That is, the first pixel PX1 may be implemented by the first light emitting device LE1 and the first pixel circuit PC1 connected to the first light emitting device LE1.

A plurality of second light emitting devices LE2 may be arranged in the second display area DA2 of the display apparatus 10. According to an embodiment, a second pixel circuit PC2 controlling light emission of the second light emitting device LE2 may not be arranged in the second display area DA2 but may be arranged in a peripheral area PA. In various other embodiments, the second pixel circuit PC2 may be arranged in a portion of the first display area DA1 or may be arranged between the first display area DA1 and the second display area DA2.

The second pixel circuit PC2 may include at least one thin film transistor TFT' and may be electrically connected to the second light emitting device LE2 by a connection line CWL. For example, the connection line CWL may include a transparent conductive material. The second pixel circuit PC2 may control light emission of the second light emitting device LE2. The second light emitting device LE2 may emit light through an emission area, and a second pixel PX2 may include the emission area. That is, the second pixel PX2 may be implemented by the second light emitting device LE2 and the second pixel circuit PC2 connected to the second light emitting device LE2.

Also, an area in the second display area DA2 in which the second light emitting element LE2 is not arranged may include a transmission area TA. The transmission area TA may be an area through which the light/signal output from or input to the electronic component 40 arranged corresponding to the second display area DA2 is transmitted.

The connection line CWL electrically connecting the second pixel circuit PC2 to the second light emitting device LE2 may be arranged in the transmission area TA. Because the connection line CWL may include a transparent conductive material having a high transmittance, degradation of the transmittance of the transmission area TA may be prevented even when the connection line CWL is arranged in the transmission area TA.

Also, in an embodiment, because the second pixel circuit PC2 is not arranged in the second display area DA2, the area of the transmission area TA may be sufficiently secured and thus the light transmittance of the second display area DA2 may be further improved.

The light emitting device LE may be covered by a thin film encapsulation layer TFEL or by an encapsulation substrate (not illustrated). In scene embodiments, the thin film encapsulation layer TFEL may include at least one inorganic encapsulation layer and at least one organic encapsulation layer as illustrated in FIG. 2. In an embodiment, the thin film encapsulation layer TFEL may include a first inorganic encapsulation layer 131 and a second inorganic encapsulation layer 133 and an organic encapsulation layer 1 interposed therebetween.

When the light emitting device LE is encapsulated by an encapsulation substrate (not illustrated), the encapsulation substrate may be arranged to face the substrate 100 with the light emitting device LE interposed therebetween. A gap may be formed between the encapsulation substrate and a light emitting device layer. The encapsulation substrate may include glass. A sealant including frit or the like may be arranged between the substrate 100 and the encapsulation substrate, and the sealant may be arranged in the peripheral area PA described above. The sealant arranged in the peripheral area PA may surround the display area DA to prevent moisture from penetrating through the side surface thereof.

The touch screen layer TSL may be configured to obtain coordinate information according to an external input, for example, a touch event. The touch screen layer TSL may include a touch electrode and touch litres connected to the touch electrode. The touch screen layer TSL may sense an external input by using a self-capacitance method or a mutual capacitance method.

The touch screen layer TSL may be formed over the thin film encapsulation layer TFEL. Alternatively, the touch screen layer TSL may be separately formed over a touch substrate and then coupled onto the thin film encapsulation layer TFEL through an adhesive layer such as an optical clear adhesive (OCA). In an embodiment, the touch screen layer TSL may be directly formed over the thin film encapsulation layer TFEL, and in this case, an adhesive layer may not be disposed between the touch screen layer TSL and the thin film encapsulation layer TFEL.

The optical functional layer OFL may include an anti-reflection layer (not illustrated). The anti-reflection layer may be configured to reduce the reflectance of light (external light) incident from the outside toward the electronic apparatus 1.

In some embodiments, the optical functional layer OFL may include a polarization film. In an embodiment, the optical functional layer OFL may include an opening OFL_OP corresponding to the transmission area TA. In other embodiments, the opening OFL_OP of the optical function layer OFL may entirely correspond to the second display area DA2. Accordingly, the light transmittance of the transmission area TA may be significantly improved. The opening OFL_OP may be filled with a transparent material such as optically clear resin.

In some embodiments, the optical functional layer OFL may be provided as a filter plate including a black matrix and color filters.

The panel protection layer PB may be attached under the substrate 100 to support and protect the substrate 100. The panel protection layer PB may include an opening PB_OP corresponding to the second display area. DA2. Because the panel protection layer PB includes the opening PB_OP, the light transmittance of the second display area DA2 may be improved. The panel protection layer PB may include polyethylene terephthalate (PET) or polyimide (PI).

The area of the second display area DA2 may be greater than the area where the electronic component 40 is arranged. Accordingly, the area of the opening PB_OP in the panel protection layer PB may not match the area of the second display area DA2.

A plurality of electronic components 40 may be arranged in the second display area DA2. In this case, the plurality of electronic components 40 may have different functions. For example, the plurality of electronic components 40 may include at least two of a camera (imaging device), a solar cell, a flash, a proximity sensor, an illuminance sensor, and an iris sensor.

In some embodiments, a bottom metal layer BML may be arranged in the second display area DA2. The bottom metal layer BML may be arranged between the substrate 100 and the second light emitting device LE2 to overlap the second light emitting device LE2. The bottom metal layer BML may include a light blocking material and may block external light from reaching the second light emitting device LE2.

In some embodiments, the bottom metal layer BML may be formed to correspond to the entire second display area DA2 and may be provided to include a hole corresponding to the transmission area TA. In this case, the hole may be provided in various shapes such as polygonal, circular, or atypical shapes to control the diffraction characteristics of external light.

FIGS. 3A to 3F are plan views schematically illustrating a portion of a display apparatus according to embodiments.

Figure 3A:
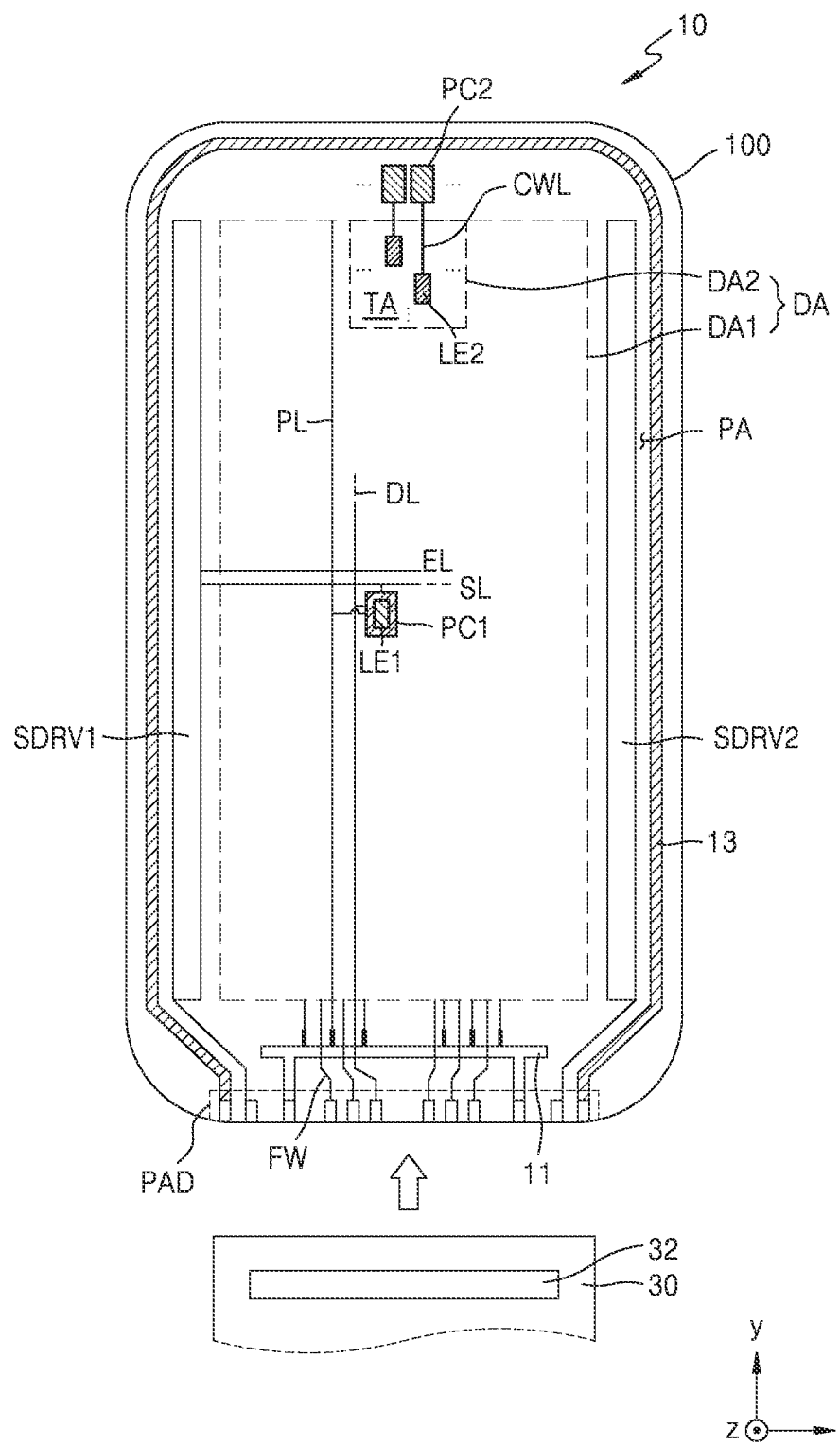
FIGS. 3A, 3B, 3C, 3D, 3E and 3F are plan views schematically illustrating a portion of a display apparatus according to embodiments.

Referring to FIG. 3A, various components constituting a display apparatus 10 may be arranged over a substrate 100. The display apparatus 10 may include a display area DA and a peripheral area PA surrounding the display area DA. The display area DA may include a first display area DA1 displaying a first image and a second display area DA2 including a transmission area TA and displaying a second image. The second image may form one entire image together with the first image, and the second image may be independent of the first image.

A first light emitting device LE1 such as an organic light emitting diode OLED may be arranged in the first display area DA1. The first light emitting device LE1 may emit light of a certain color through a first pixel PX1 (see FIG. 1). That is, the first pixel PX1 may be implemented by the first light emitting device LE1, and the first pixel PX1 may be a subpixel. The first light emitting device LE1 may emit, for example, red, green, blue, or white light. A first pixel circuit PC1 driving the first light emitting device LE1 may be arranged in the first display area DA1 and may be electrically connected to the first light emitting device LE1. For example, the first pixel circuit PC1 may be arranged to overlap the first light emitting device LE1.

As illustrated in FIG. 3A, the second display area DA2 may be located at one side of the entire display area DA and may be partially surrounded by the first display area DA1. A second light emitting device LE2 such as an organic light emitting diode OLED may be arranged in the second display area DA2. The second light emitting device LE2 may emit light of a certain color through a second pixel PX2 (see FIG. 1). That is, the second pixel PX2 may be implemented by the second light emitting device LE2, and the second pixel PX2 may be a subpixel. The second light emitting device LE2 may emit, for example, red, green, blue, or white light.

A second pixel circuit PC2 driving the second light emitting device LE2 may be arranged in the peripheral area PA and may be electrically connected to the second light emitting device LE2. For example, the second pixel circuit PC2 may be arranged in the peripheral area PA adjacent to the second display area DA2. That is, the second pixel circuit PC2 may be arranged adjacent to an outer side of the second display area DA2. As illustrated in FIG. 3A, when the second display area DA2 is arranged at an upper side of the entire display area DA, the second pixel circuit PC2 may be arranged at an upper side of the peripheral area PA. The second pixel circuit PC2 and the second light emitting device LE2 may be electrically connected to each other by, for example, a connection line CWL extending in the y direction. For example, the connection line CWL may extend in the same direction as the extension direction of a data line DL.

Moreover, the second display area DA2 may include a transmission area TA. The transmission area TA may be arranged to surround second light emitting devices LE2. Alternatively, the transmission area TA may be arranged in a grid form with a plurality of second light emitting devices LE2.

Each of the first pixel circuit PC1 and the second pixel circuit PC2 may be electrically connected to outer circuits arranged in the peripheral area PA. A first scan driving circuit SDRV1, a second scan driving circuit SDRV2, a pad area PAD, a driving voltage supply line 11, and a common voltage supply line 13 may be arranged in the peripheral area PA.

The first scan driving circuit SDRV1 may apply a scan signal to each of the first pixel circuits PC1 driving the first light emitting devices LE1 through a scan line SL. The first scan driving circuit SDRV1 may apply an emission control signal to each of the first pixel circuits PC1 through an emission control line EL. The second scan driving circuit SDRV2 may be located on the opposite side of the first scan driving circuit SDRV1 with respect to the first display area DA1 and may be substantially parallel to the first scan driving circuit SDRV1. Some of the first pixel circuits PC1 of the first display area DA1 may be electrically connected to the first scan driving circuit SDRV1 and the others may be electrically connected to the second scan driving circuit SDRV2.

In some embodiments, although not illustrated, each of the second pixel circuits PC2 driving the second light emitting devices LE2 may also receive a scan signal and an emission control signal from the first scan driving circuit SDRV1 and/or the second scan driving circuit SDRV2 through the scan line SL and/or separate lines extending from the emission control line EL.

The pad area PAD may be arranged at one side of the substrate 100. Each pad of the pad area PAD may be exposed by a contact hole formed through an insulating layer to be connected to a display circuit board 30. A display driver 32 may be arranged on the display circuit board 30.

The display driver 32 may generate a control signal to be transmitted to the first scan driving circuit SDRV1 and the second scan driving circuit SDRV2. The display driver 32 may generate a data signal. The generated data signal may be transmitted to the first pixel circuits PC1 through a fanout line FW and a data line DL connected to the fanout line FW. Also, although not illustrated, the data signal may also be transmitted to the second pixel circuits PC2 through the data line DL or separate lines extending from the data line DL.

The display driver 32 may supply a driving voltage ELVDD to the driving voltage supply line 11 and may supply a common voltage ELVSS to the common voltage supply line 13. The driving voltage ELVDD may be applied to the first pixel circuit PC1 through a driving voltage line PL connected to the driving voltage supply line 11, and although not illustrated, the driving voltage ELVDD may also be applied to the second pixel circuits PC2 through the driving voltage supply line 11 or separate lines extending from the driving voltage supply line 11. The common voltage ELVSS may be connected to the common voltage supply line 13 to be applied to an opposite electrode of each of the first light emitting device LE1 and the second light emitting device LE2.

The driving voltage supply line 11 may extend, for example, in the x direction under the first display area DA1. The common voltage supply line 13 may have a loop shape in which one side is open to partially surround the first display area DA1.

Figure 3B:
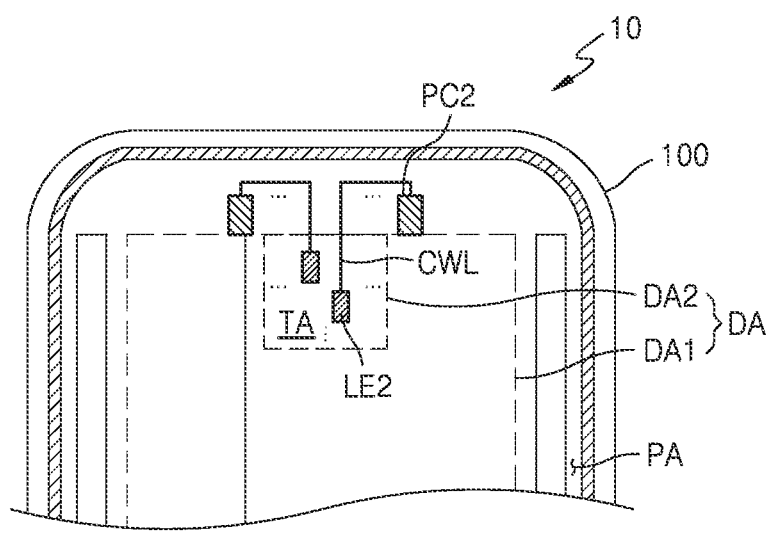

Referring to FIG. 3B, the second pixel circuit PC2 may be arranged in the peripheral area PA adjacent to the first display area DA1. The second pixel circuit PC2 may be arranged adjacent to an outer side of the first display area DA1. In this case, the second pixel circuit PC2 and the second light emitting device LE2 may be electrically connected to each other by, for example, a connection line CWL extending in the x direction and the y direction. The connection line CWL may extend, for example, in the same direction as the extension direction of the scan line SL and/or in the same direction as the extension direction of the data line DL.

Figure 3C:
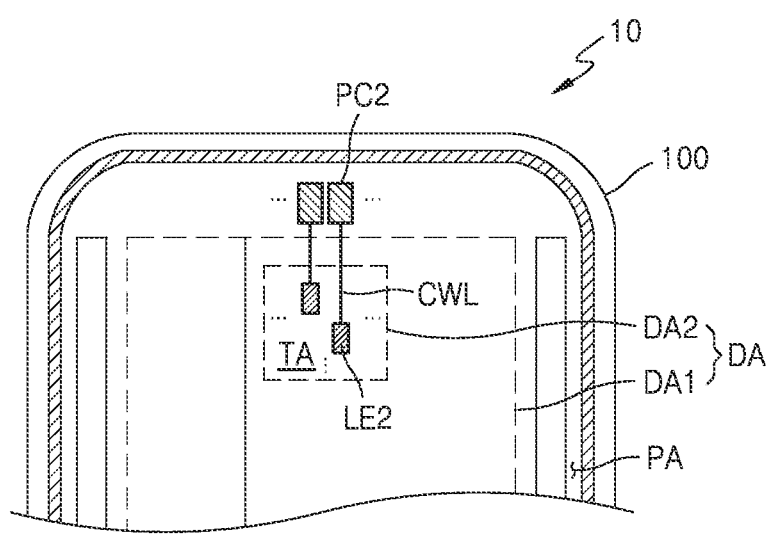

Referring to FIG. 3C, the second display area DA2 may be arranged inside the first display area DA1 to be entirely surrounded by the first display area DA1. A second light emitting device LE2 may be arranged in the second display area DA2 and a second pixel circuit PC2 driving the second light emitting device LE2 may be arranged in the peripheral area PA located over the second display area DA2. The second pixel circuit PC2 and the second light emitting device LE2 may be electrically connected to each other by a connection line CWL. In this case, the connection line CWL may extend, for example, in the same direction as the extension direction of the data line DL.

Figure 3D:
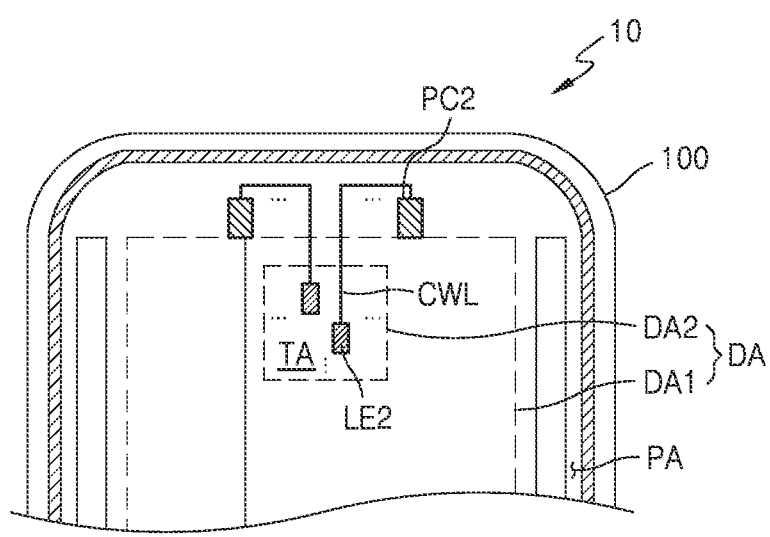

Referring to FIG. 3D, the second light emitting device LE2 may be arranged in the second display area DA2 arranged inside the first display area DA1. For example, the second pixel circuit PC2 driving the second light emitting device LE2 may be arranged in the peripheral area PA located on the upper left side and/or the upper right side of the second display area DA2. The second pixel circuit PC2 and the second light emitting device LE2 may be electrically connected to each other by a connection line CWL, and in this case, the connection line CWL may extend, for example, in the same direction as the extension direction of the scan line SL and/or in the same direction as the extension direction of the data line DL.

Figure 3E:
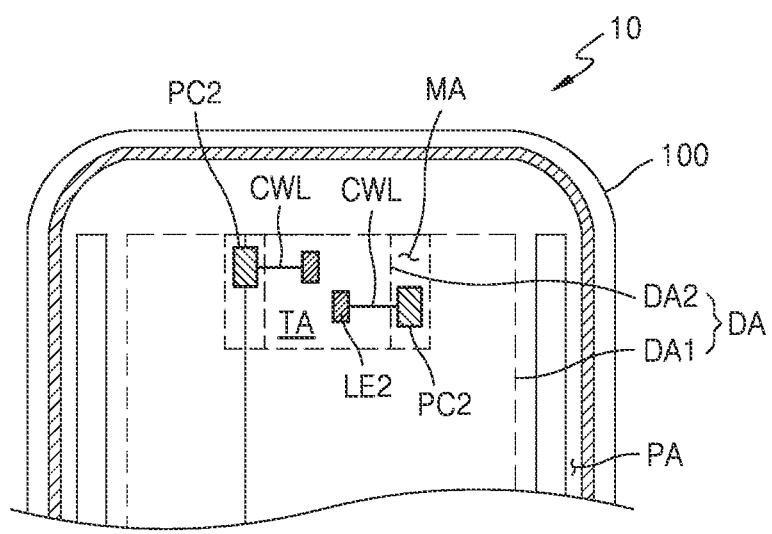

Referring to FIG. 3E, the second display area DA2 may be arranged at one side of the entire display area DA to be partially surrounded by the first display area DA1. In an embodiment, an intermediate area MA may be located between the first display area DA1 and the second display area DA2. The intermediate area MA may be arranged to surround at least a portion of the second display area DA2. For example, the intermediate area MA may be arranged on the left side and/or the right side of the second display area DA2. Alternatively, the intermediate area MA may also be arranged on the lower side of the second display area DA2.

A second light emitting device LE2 may be arranged in the second display area DA2 and a second pixel circuit PC2 driving the second light emitting device LE2 may be arranged in the intermediate area MA. The second pixel circuit PC2 and the second light emitting device LE2 may be electrically connected to each other by a connection line CWL. When the intermediate area MA is arranged on the left side and/or the right side of the second display area DA2, the connection line CWL may extend, for example, in the same direction as the scan line SL.

In an embodiment, the number of second pixel circuits PC2 arranged per unit area in the intermediate area MA may be equal to or less than the number of first pixel circuits PC1 arranged per unit area in the first display area DA1.

Figure 3F:
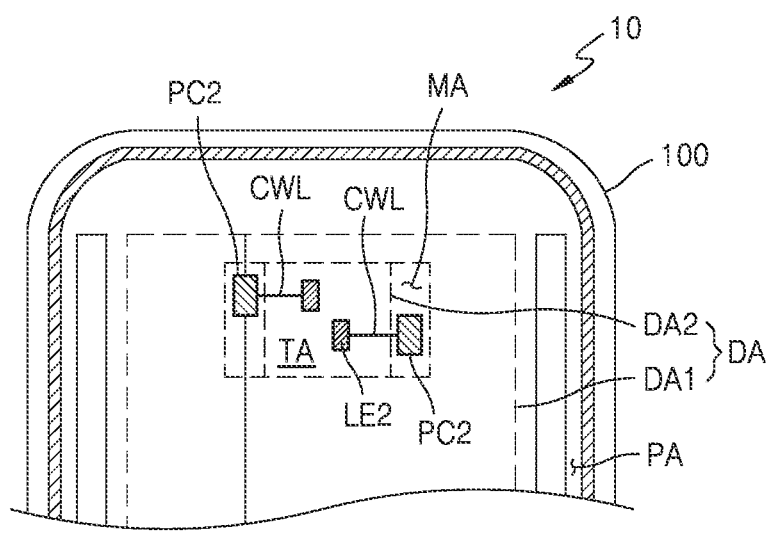

Referring to FIG. 3F, the second display area DA2 may be arranged inside the first display area DA1 to be entirely surrounded by the first display area DA1. An intermediate area MA may be located the first display area DA1 and the second display area DA2. In an embodiment, not only the second display area DA2 but also the intermediate area MA may be entirely surrounded by the first display area DA1.

In an embodiment, the in mediate area MA may entirely or partially surround the second display area DA2. For example, as illustrated in FIG. 3F, the intermediate area MA may be arranged on the left side and/or the right side of the second display area DA2. Alternatively, the intermediate area MA may also be arranged on the upper side and/or the lower side of the second display area DA2.

A second light emitting device LE2 may be arranged in the second display area DA2 and a second pixel circuit PC2 driving the second light emitting device LE2 may be arranged in the intermediate area MA. The second pixel circuit PC2 and the second light emitting device LE2 may be electrically connected to each other by a connection line CWL. When the intermediate area MA is arranged on the left side and/or the right side of the second display area DA2, the connection line CWL may extend, for example, in the same direction as the extension direction of the scan line SL. Although not illustrated, when the intermediate area MA is arranged on the upper side and/or the lower side of the second display area DA2, the connection line CWL may extend, for example, in the same direction as the extension direction of the scan line SL and in the same direction as the extension direction of the data line DL.

In an embodiment, the number of second pixel circuits PC2 arranged per unit area in the intermediate area MA may be equal to or less than the number of first pixel circuits PC1 arranged per unit area in the first display area DA1.

As described above, the arrangement of the second pixel circuit PC2 may be variously modified.

Figure 4:
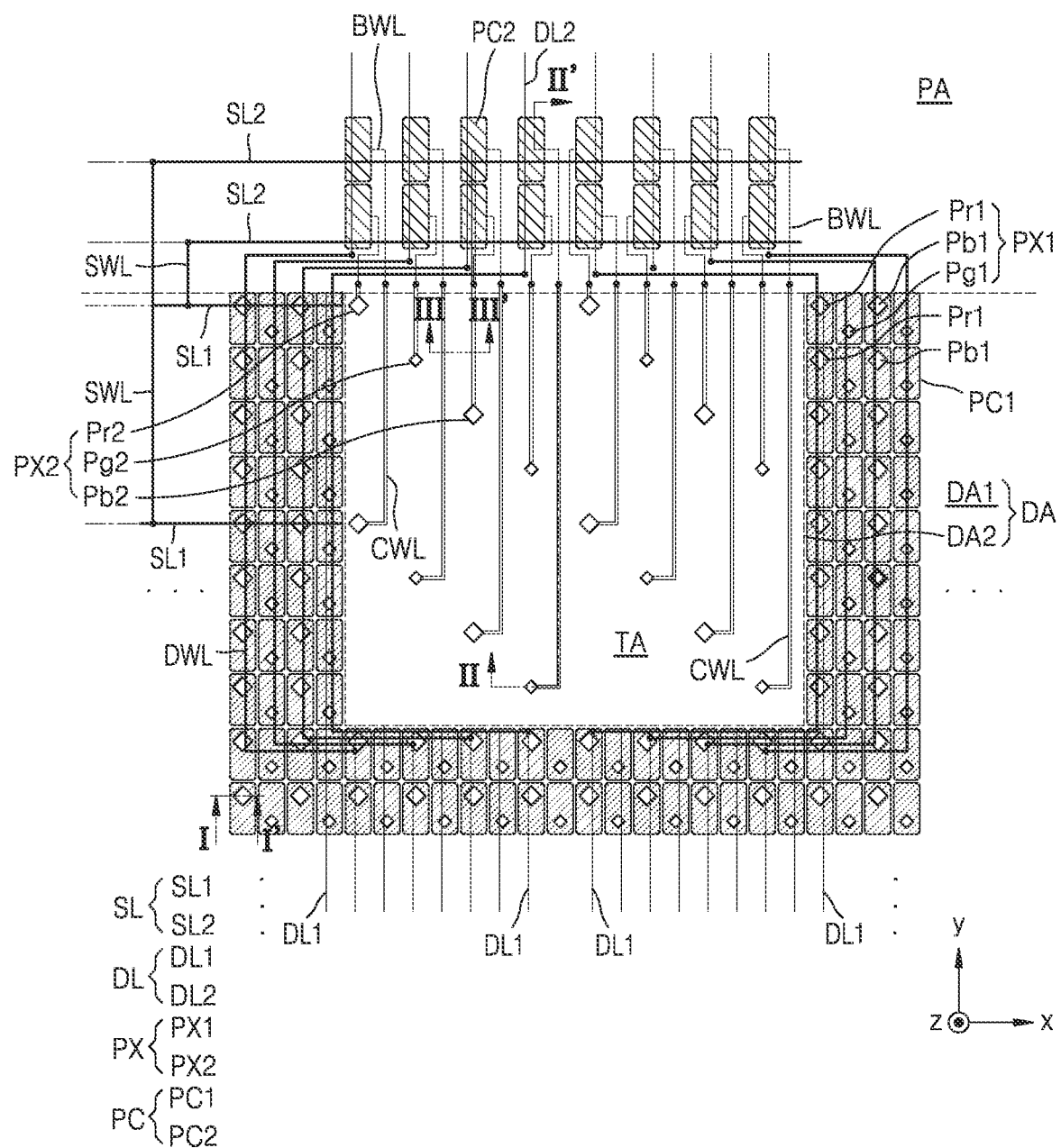
FIG. 4 is a plan layout diagram schematically illustrating a partial area of a display apparatus according to an embodiment.

FIG. 4 is a plan layout diagram schematically illustrating a partial area of a display apparatus according to an embodiment. FIG. 4 illustrates a second display area DA2 and a portion of a first display area DA1, and a peripheral area PA surrounding the second display area DA2 and the first display area DA1, and shows the arrangement of a plurality of pixels PX and a plurality of pixel circuits PC.

Referring to FIG. 4, a plurality of first pixels PX1 may be arranged in the first display area DA1. Herein, the pixel PX may refer to a subpixel as a minimum unit for implementing an image and may include an emission area where a light emitting device emits light. When a light emitting device is an organic light emitting diode OLED, the emission area may be defined by an opening of a pixel definition layer. This will be described below with reference to FIG. 5.

Each of the plurality of first pixels PX1 may emit any one of red, green, blue, and white light. For example, the plurality of first pixels PX1 may include a red first pixel Pr1, a green first pixel Pg1, and a blue first pixel Pb1.

The plurality of first pixels PX1 may be arranged in various configurations and may be arranged, for example, in a Pentile® type as illustrated in FIG. 4. For example, red first pixels Pr1 may be arranged at first and third vertexes facing each other among the vertexes of a virtual square having a center point of a green first pixel Pg1 as a center point thereof, and blue first pixels Pb1 may be arranged at second and fourth vertexes as the other vertexes thereof. The size of the green first pixel Pg1 may be less than the size of each of the red first pixel Pr1 and the blue first pixel Pb1. Through this arrangement, a high resolution may be implemented with a small number of pixels. However, the disclosure is not limited thereto and the plurality of first pixels PX1 may be arranged in various shapes such as a stripe type, a mosaic arrangement type, and a delta arrangement type.

In the first display area DA1, first pixel circuits PC1 may be arranged to overlap the first pixels PX1. The first pixel circuits PC1 may be arranged, for example, in a matrix configuration forming rows and columns in the x direction and the y direction.

A plurality of second pixels PX2 may be arranged in the second display area DA2. Each of the plurality of second pixels PX2 may emit any one of red, green, blue, and white light. For example, the plurality of second pixels PX2 may include a red second pixel Pr2, a green second pixel Pg2, and a blue second pixel Pb2.

In the second display area DA2, the plurality of second pixels PX2 may be arranged in various configuration. In an embodiment, some second pixels PX2 may form a pixel group, and in the pixel group, the second pixels PX2 may be arranged in various types such as a Pentile® type, a stripe type, a mosaic arrangement type, and a delta arrangement type.

As illustrated in FIG. 4, the second pixels PX2 may be arranged in the second display area DA2. That is, the distance between the second pixels PX2 may be greater than the distance between the first pixels PX1. Thus, as described above, the number of second pixels PX2 per unit area in the second display area DA2 may be less than the number of first pixels PX1 per unit area in the first display area DA1. Moreover, an area in the second display area DA2 in which the second pixels PX2 are not arranged may include a transmission area TA having a high light transmittance.

Second pixel circuits PC2 may be arranged in the peripheral area PA and may not overlap the second pixels PX2. Because the second pixel circuits PC2 are not arranged in the second display area DA2, the second display area DA2 may secure a wider transmission area TA. Also, because lines for applying a constant voltage and signals to the second pixel circuit PC2 are not arranged in the second display area DA2, the second pixels PX2 may be freely arranged without considering the arrangement of the lines.

Moreover, in order for the second pixel circuits PC2 arranged in the peripheral area PA to drive the second pixel PX2 arranged in the second display area DA2, a connection line CWL and/or a bridge line BWL may be provided. The connection line CWL and/or the bridge line BWL may include a conductive material and may electrically connect the second pixel circuit PC2 to the second pixel PX2. For example, the second pixel circuit PC2 may be electrically connected to the second pixel PX2 through the connection line CWL. As another example, the second pixel circuit PC2 may be electrically connected to the second pixel PX2 through the connection line CWL and the bridge line BWL that are electrically connected to each other. Here, electrically connected to the second pixel PX2 may mean electrically connected to a pixel electrode of the second light emitting device LE2 (see FIGS. 3A and 3B) constituting the second pixel PX2. Hereinafter, for convenience of description, a case where both the connection line CWL and the bridge line BWL are provided will be described.

The connection line CWL may be at least partially arranged in the second display area DA2 and may include a transparent conductive material. The connection line CWL may include, for example, a transparent conducting oxide (TCO). For example, the connection line CWL may include a conductive oxide such as indium tin oxide (ITO), indium zinc oxide (IZO), zinc oxide (ZnO), indium oxide (In$_2$O$_3$), indium gallium oxide (IGO), indium zinc gallium oxide (IZGO), or aluminum zinc oxide (AZO). Accordingly, even when the connection line CWL is arranged in the transmission area TA of the second display area DA2, the degradation of the light transmittance of the transmission area TA may be minimized.

The bridge line BWL may be arranged in the peripheral area PA. The bridge line BWL may be electrically connected to the connection line CWL through a contact hole at one end portion thereof and may be electrically connected to the second pixel circuit PC2 at the other end portion thereof.

The bridge line BWL may include a metal material. For example, the bridge line BWL may include a metal material including molybdenum (Mo), aluminum (Al), copper (Cu), titanium (Ti), or the like and may include a single layer or multiple layers including the above material.

The bridge line BWL may have higher conductivity than the connection line CWL. Because the bridge line BWL is arranged in the peripheral area PA and thus does not need to secure light transmittance, the bridge line BWL may include a material having lower light transmittance and higher conductivity than the connection line CWL. Accordingly, the resistance value between the second pixel circuit PC2 and the second pixel PX2 may be minimized.

The scan line SL may include a first scan line SL1 connected to the first pixel circuits PC1 and a second scan line SL2 connected to the second pixel circuits PC2. The first scan line SL1 may extend in the x direction and may be connected to the first pixel circuits PC1 arranged in the same row. The first scan line SL1 may not be arranged in the second display area DA2. That is, the first scan line SL1 may be disconnected in the second display area DA2 disposed between two opposing first scan lines with the second display area DA2 interposed therebetween. In this case, the first scan line SL1 arranged on the left side of the second display area DA2 may receive a scan signal from the first scan driving circuit SDRV1 (see FIG. 3A), and the first scan line SL1 arranged on the right side of the second display area DA2 may receive a scan signal from the second scan driving circuit SDRV2 (see FIG. 3A).

The second scan line SL2 may be connected to the second pixel circuits PC2 driving the second pixel PX2 arranged in the same row among the second pixel circuits PC2 arranged in the same row.

The first scan line SL1 and the second scan line SL2 may be connected by a scan connection line SWL, and the same signal may be applied to the pixel circuits driving the first pixel PX1 and the second pixel PX2 arranged in the same row.

The scan connection line SWL may be arranged on a different layer than the first scan line SL1 and the second scan line SL2, and the scan connection line SWL may be connected to each of the first scan line SL1 and the second scan line SL2 through a contact hole. The scan connection line SWL may be arranged in the peripheral area PA.

The data line DL may include a first data line DL1 connected to the first pixel circuits PC1 and a second data line DL2 connected to the second pixel circuits PC2. The first data line DL1 may extend in the y direction and may be connected to the first pixel circuits PC1 arranged in the same column. The second data line DL2 may extend in the y direction and may be connected to the second pixel circuits PC2 arranged in the same column.

The first data line DL1 and the second data line DL2 may be arranged spaced apart from each other with the second display area DA2 interposed therebetween. The first data line DL1 and the second data line DL2 may be connected by a data connection line DWL, and the same signal may be applied to the pixel circuits driving the first pixel PX1 and the second pixel PX2 arranged in the same column.

The data connection line DWL may be arranged to bypass the second display area DA2. The data connection line DWL may be arranged to overlap the first pixel circuits PC1 arranged in the first display area DA1. As the data connection line DWL is arranged in the first display area DA1, a dead-space area may be minimized because it is not necessary to secure a separate space in which the data connection line DWL is arranged.

The data connection line DWL may be arranged on a different layer than the first data line DL1 and the second data line DL2, and the data connection line DWL may be connected to each of the first data line DL1 and the second data DL2 through a contact hole.

Figure 5:
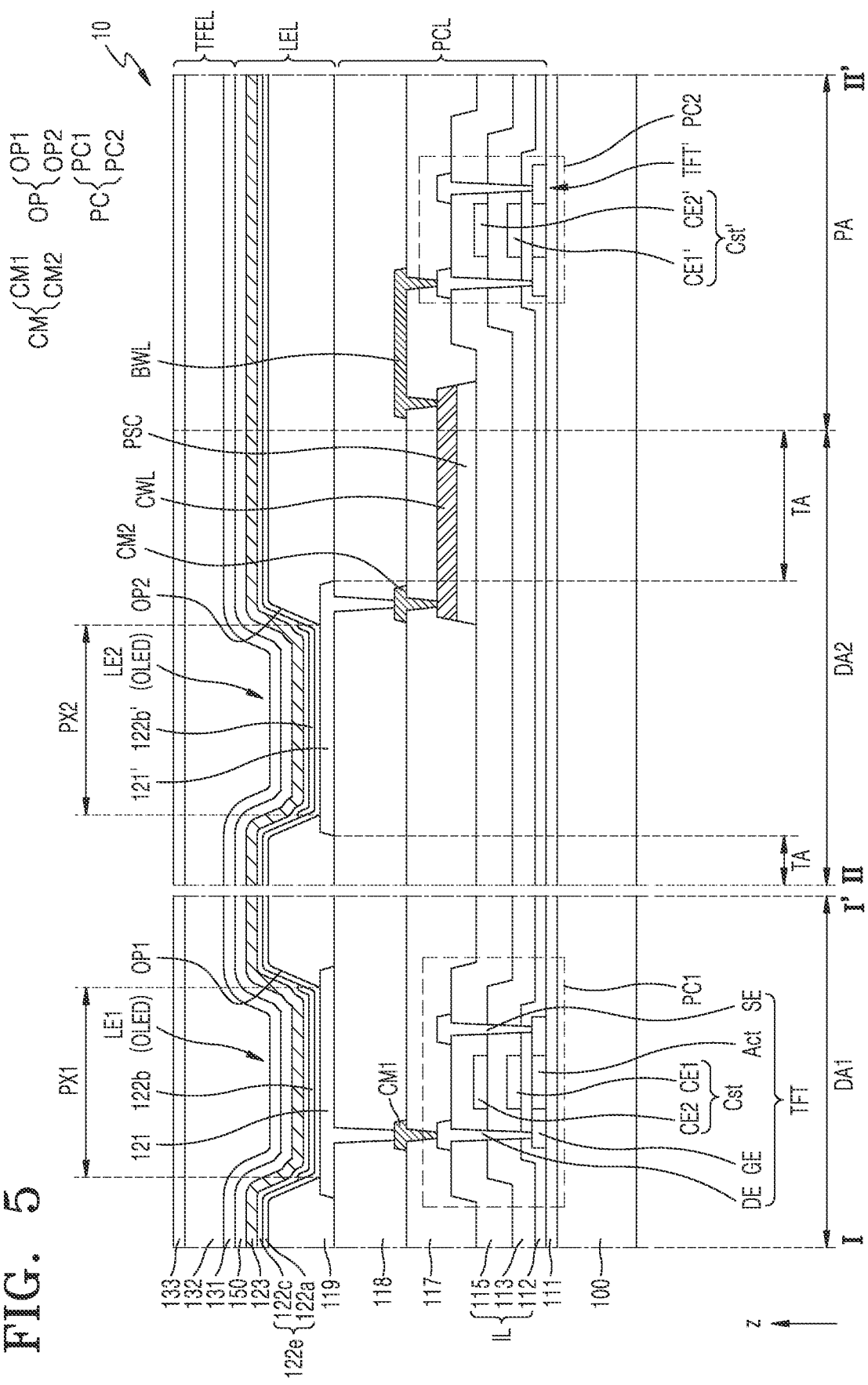
FIG. 5 is a cross-sectional view schematically illustrating a portion of the display apparatus of FIG. 4.
Figure 6:
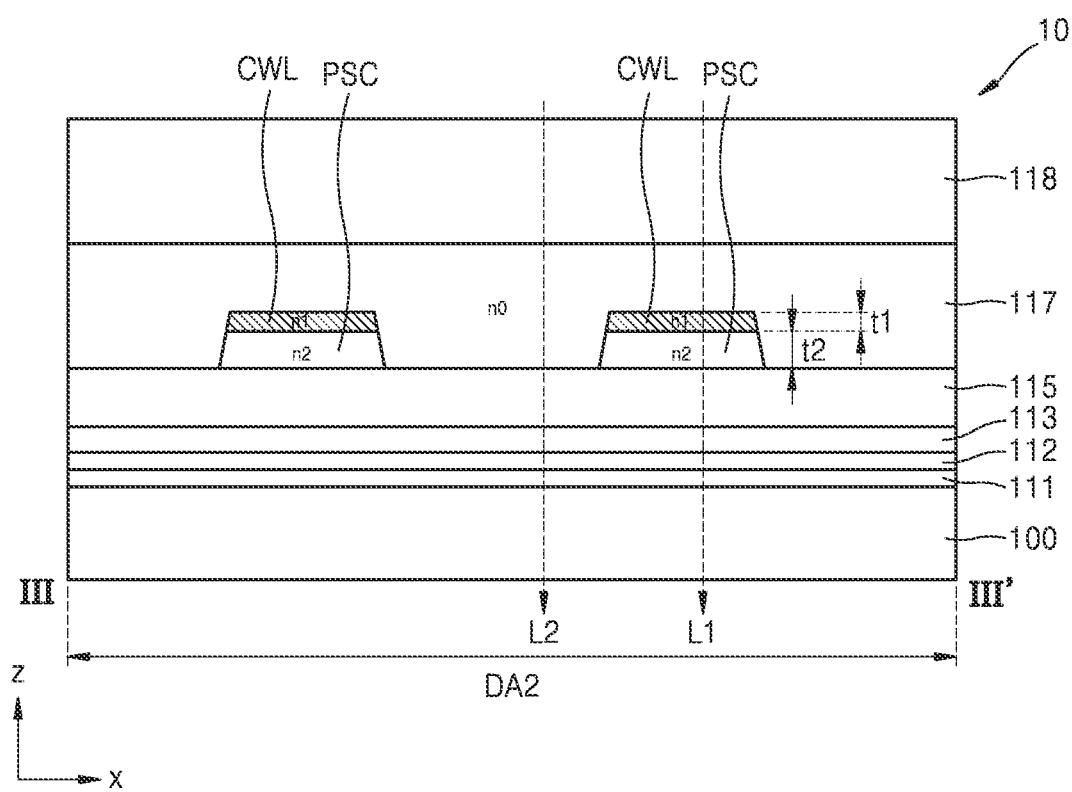
FIG. 6 is a cross-sectional view schematically illustrating a portion of the display apparatus of FIG. 4.

FIGS. 5 and 6 are cross-sectional views schematically illustrating a portion of the display apparatus of FIG. 4, FIG. 5 may correspond to cross-sections taken along lines I-I' and II-II' of FIG. 4, and FIG. 6 may correspond to a cross-section taken along line III-III' of FIG. 4.

Referring to FIG. 5, the first display area DA1 may include a first pixel PX1, and the second display area DA2 may include a second pixel PX2 and a transmission area TA. A first pixel circuit PC1 including a plurality of thin film transistors TFTs and a storage capacitor Cst, and a first light emitting device LE1 electrically connected to the first pixel circuit PC1 may be arranged in the first display area DA1. A second light emitting device LE2 may be arranged in the second display area DA2. A second pixel circuit PC2 including a plurality of thin film transistors TFT' and a storage capacitor Cst' may be arranged in the peripheral area PA.

Hereinafter, a structure in which the components included in the display apparatus 10 are stacked will be described. The display apparatus 10 may include a stack structure of a substrate 100, a buffer layer 111, a pixel circuit layer PCL, a light emitting device layer LEL, and a thin film encapsulation layer TFEL.

The substrate 100 may include an insulating material such as glass, quartz, or polymer resin. The substrate 100 may include a rigid substrate or a flexible substrate capable of bending, folding, rolling, or the like.

The buffer layer 111 may be located over the substrate 100 to reduce or block the penetration of foreign materials, moisture, or external air from under the substrate 100 and may provide a flat surface over the substrate 100. The buffer layer 111 may include an inorganic material such as oxide or nitride, an organic material, or an organic/inorganic composite and may include a single-layer or multiple-layer structure of an inorganic material and an organic material. A barrier layer (not illustrated) for blocking the penetration of external air may be further included between the substrate 100 and the buffer layer 111. In some embodiments, the buffer layer 111 may include silicon oxide ($SiO_2$) far silicon nitride ($SiN_x$).

The pixel circuit layer PCL may be arranged over the buffer layer 111 and may include a pixel circuit PC, a first gate insulating layer 112, a second gate insulating layer 113, an interlayer insulating layer 115, a first organic insulating layer 117, and a second organic insulating layer 118.

Thin film transistors TFT and TFT and storage capacitors Cst and Cst' may be arranged over the buffer layer 111. Because the thin film transistor TFT and the storage capacitor Cst' of the second pixel circuit PC2 may have substantially the same or similar configuration as the thin film transistor TFT and the storage capacitor Cst of the first pixel circuit PC1, the description of the thin film transistor TFT and the storage capacitor Cst' of the second pixel circuit PC2 will be replaced by the description of the thin film transistor TFT and the storage capacitor Cst of the first pixel circuit PC1.

Each of the thin film transistors TFT and TFT' may include a semiconductor layer Act, a gate electrode GE, a source electrode SE, and a drain electrode DE. Each of the thin film transistors TFT and TFT' may be connected to an organic light emitting diode OLED to drive the organic light emitting diode OLED.

The semiconductor layer Act may be arranged over the buffer layer 111 and may include polysilicon. In other embodiments, the semiconductor layer Act may include amorphous silicon. In other embodiments, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel area, and a source area and a drain area that are doped with dopants.

The first gate insulating layer 112 may be provided to cover the semiconductor layer Act. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 112 may include a single layer or multiple layers including the above inorganic insulating material.

The gate electrode GE may be arranged over the first gate insulating layer 112 to overlap the semiconductor layer Act. The gate electrode GE may include molybdenum (Mo), aluminum (Al), copper (Cu), titanium (Ti), or the like and may include a single layer or multiple layers. For example, the gate electrode GE may include a single layer of Mo.

The second gate insulating layer 113 may be provided to cover the gate electrode GE. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The second gate insulating layer 113 may include a single layer multiple layers including the above inorganic insulating material.

Upper electrodes CE2 and CE2' of the storage capacitors Cst and Cst' may be arranged over the second gate insulating layer 113. The upper electrodes CE2 and CE2' of the storage capacitors Cst and Cst' may overlap the gate electrode GE disposed thereunder. The gate electrode GE and the upper electrodes CE2 and CE2' overlapping each other with the second gate insulating layer 113 disposed therebetween may constitute the storage capacitors Cst and Cst'. In this case, the gate electrode GE may function as lower electrodes CE1 and CE1' of the storage capacitors Cst and Cst'.

The upper electrodes CE2 and CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

The interlayer insulating layer 115 may be formed to cover the upper electrodes CE2 and CE2'. The interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 115 may include a single layer or multiple layers including the above inorganic insulating material.

The source electrode SE and the drain electrode DE may be arranged over the interlayer insulating layer 115. The source electrode SE and the drain electrode DE may include a conductive material including molybdenum (Mo), aluminum (Al), copper (Cu), titanium (Ti), or the like and may include a single layer or multiple layers including the above material. For example, the source electrode SE and the drain electrode DE may include a multilayer structure of Ti/Al/Ti.

The first organic insulating layer 117 may be arranged over the interlayer insulating layer 115 and may cover the source electrode SE and the drain electrode DE.

The first organic insulating layer 117 may include a photosensitive polyimide or a siloxane-based organic material. For example, the first organic insulating layer 117 may include, as a photosensitive polyimide, a general-purpose polymer such as polyimide, polystyrene (PS), polycarbonate (PC), benzocyclobutene (BCB), hexamethyldisiloxane (HMDSO), or polymethylmethacrylate (PMMA), a polymer derivative having a phenolic group, an acrylic polymer, an imide-based polymer, an aryl ether-based polymer, an amide-based polymer, a fluorine-based polymer, a p-xylene-based polymer, or a vinyl alcohol-based polymer. Alternatively, the first organic insulating layer 117 may include, as a siloxane-based organic material, hexamethyldisiloxane, octamethyltrisiloxane, decamethyltetrasiloxane, dodecamethylpentasiloxane, and polydimethylsiloxane.

The second organic insulating layer 118 may be arranged over the first organic insulating layer 117. The second organic insulating layer 118 may have a flat upper surface such that pixel electrodes 121 and 121' arranged thereover may be formed flat. The second organic insulating layer 118 may include a siloxane-based organic material having high light transmittance and high flatness. The siloxane-based organic material may include hexamethyldisiloxane, octamethyltrisiloxane, decamethyltetrasiloxane, dodecamethylpentasiloxane, and polydimethylsiloxane.

Alternatively, the second organic insulating layer 118 may include a general-purpose polymer such as photosensitive polyimide, polyimide, benzocyclobutene (BCB), hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, or a vinyl alcohol-based polymer.

A contact metal (CM) and/or various lines may be arranged between the first organic insulating layer 117 and the second organic insulating layer 118 which may be advantageous for high integration. The contact metal CM and the various lines may include, for example, a metal material including molybdenum (Mo), aluminum (Al), copper (Cu), titanium (Ti), or the like and may include a single layer or multiple layers including the above material.

The light emitting device layer LEL may be arranged over the second organic insulating layer 118. The light emitting device layer LEL may include a first light emitting device LE1, a second light emitting device LE2, and a pixel definition layer 119.

The first light emitting device LE1 and the second light emitting device LE2 may be provided as an organic light emitting diode OLED. The organic light emitting diode OLED may include a stack structure of pixel electrodes 121 and 121', emission layers 122b and 122b', and an opposite electrode 123.

The pixel electrodes 121 and 121' may include a conductive oxide such as indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO). The pixel electrodes 121 and 121' may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrodes 121 and 121' may have a structure including layers formed of ITO, IZO, ZnO, or $In_2O_3$ over/under the reflective layer. In this case, the first pixel electrodes 121 and 121' may have a stack structure of ITO/Ag/ITO.

The pixel definition layer 119 may be arranged over the second organic insulating layer 118 and may cover edges of the pixel electrodes 121 and 121'. The pixel definition layer 119 may include an opening OP exposing center portions of the pixel electrodes 121 and 121'. For example, the pixel definition layer 119 may include a first opening OP1 exposing a center portion of the pixel electrode 121 of the first light emitting device LE1 and a second opening OP2 exposing a center portion of the pixel electrode 121' of the second light emitting device LE2. An emission area of the organic light emitting diode OLED may be defined by the opening OP. That is, the size and shape of the emission area of the first, pixel PX1 may be defined by the first opening OP1, and the size and shape of the emission area of the second pixel PX2 may be defined by the second opening OP2.

The pixel definition layer 119 may increase the distance between the edge of the pixel electrodes 121 and 121' and the opposite electrode 123 over the pixel electrodes 121 and 121' to prevent an arc or the like from occurring at the edge of the pixel electrodes 121 and 121'. The pixel definition layer 119 may be formed of an organic insulating material such as polyimide, polyamide, acrylic resin, benzocyclobutene, hexamethyldisiloxane (HMDSO), or phenol resin by spin coating or the like.

The emission layers 122b and 122b' formed to correspond to the pixel electrodes 121 and 121' may be arranged inside the opening OP of the pixel definition layer 119. The emission layers 122b and 122b' may include a high molecular weight material or a low molecular weight material and may emit red, green, blue, or white light.

An organic functional layer 122e may be arranged over and/or under the emission layers 122b and 122b'. The organ functional layer 122e may include a first functional layer 122a and/or a second functional layer 122c. The first functional layer 122a or the second functional layer 122c may be omitted.

The first functional layer 122a may be arranged under the emission layers 122b and 122b'. The first functional layer 122a may include a single layer or multiple layers including organic material. The first functional layer 122a may include a hole transport layer (HTL) having a single-layer structure. Alternatively, the first functional layer 122a may include a hole injection layer (HIL) and an HTL. The first functional layer 122a may be integrally formed to correspond to the first light emitting devices LE1 and the second light emitting devices LE2 respectively provided in the first display area DA1 and the second display area DA2.

The second functional layer 122c may be arranged over the emission layers 122b and 122b'. The second functional layer 122c may include a single layer or multiple layers including an organic material. The second functional layer 122c may include an electron transport layer (ETL) and/or an electron injection layer (EIL). The second functional layer 122c may be integrally formed to correspond to the first light emitting devices LE1 and the second light emitting devices LE2 respectively provided in the first display area DA1 and the second display area DA2.

The opposite electrode 123 may be arranged over the second functional layer 122c. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may further include a layer such as ITO, IZO, ZnO, or $In_2O_3$ over the (semi)transparent layer including the above material. The opposite electrode 123 may be integrally formed to correspond to the first light emitting devices LE1 and the second light emitting devices LE2 respectively provided in the first display area DA1 and the second display area DA2.

The stack structures from the pixel electrode 121 to the opposite electrode 123 formed in the first display area DA1 may constitute the organic light emitting diode OLED as the first light emitting device LE1. The stack structures from the pixel electrode 121' to the opposite electrode 123 formed in the second display area DA2 may constitute the organic light emitting diode OLED as the second light emitting device LE2.

In some embodiments, a capping layer 150 may be formed over the opposite electrode 123. The capping layer 150 may be provided to protect the opposite electrode 123 and improve light extraction efficiency. The capping layer 150 may include an organic material. Alternatively, the capping layer 150 may include LiF. Alternatively, the capping layer 150 may include an inorganic insulating material such as silicon oxide ($SiO_2$) or silicon nitride ($SiN_x$).

In an embodiment, the thin film encapsulation layer TFEL may be arranged over the light emitting device layer LEL. The thin film encapsulation layer TFEL may include at least one inorganic encapsulation layer and at least one organic encapsulation layer. In an embodiment, the thin film encapsulation layer TFEL may include a first inorganic encapsulation layer 131 and a second inorganic encapsulation layer 133 and an organic encapsulation layer 132 interposed therebetween.

For example, the first inorganic encapsulation layer 131 and the second inorganic encapsulation layer 133 may include one or more inorganic insulating materials such as silicon oxide (SiO$_2$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), hafnium oxide (HfO$_2$), or zinc oxide (ZnO) and may be formed by chemical vapor deposition (CVD) or the like. The organic encapsulation layer 132 may include a polymer-based material. The polymer-based material may include silicon-based resin, acryl-based resin, epoxy-based resin, polyimide, polyethylene, or the like. Each of the first inorganic encapsulation layer 131, the organic encapsulation layer 132, and the second inorganic encapsulation layer 133 array be integrally formed to cover the first display area DA1 and the second display area DA2.

Moreover, both the first light emitting device LE1 and the first pixel circuit PC1 driving the first light emitting device LE1 may be located in the first display area DA1, and the first light emitting device LE1 and the first pixel circuit PC1 may be arranged to overlap each other. The pixel electrode 121 of the first light emitting device LE1 may be electrically connected to the first pixel circuit PC1 through a first contact metal CM1.

According to an embodiment, the second light emitting device LE2 may be located in the second display area DA2, while the second pixel circuit PC2 driving the second light emitting device LE2 may be located in the peripheral area PA. A connection line CWL may be provided to electrically connect the second light emitting device LE2 and the second pixel circuit PC2 to each other. The connection line CWL may extend from the second display area DA2 to the peripheral area PA and may be at least partially arranged in the second display area DA2.

In an embodiment, the connection line CWL may be arranged over the interlayer insulating layer 115. The connection line CWL may be covered by the first organic insulating layer 117. In an embodiment, the first contact metal CM1 and a bridge line BWL may be arranged over the first organic insulating layer 117. The first contact metal CM1 and the bridge line BWL may be covered by the second organic insulating layer 118. The connection line CWL may be electrically connected to the pixel electrode 121' of the second light emitting device LE2 through a second contact metal CM2 and may also be electrically connected to the second pixel circuit PC2 through the bridge line BWL located in the peripheral area PA.

According to an embodiment, a phase compensation layer PSC at least partially arranged in the second display area DA2 and overlapping the connection line CWL in the plan view may be provided. That is, in a view in a direction perpendicular to one surface of the substrate 100, the connection line CWL and the phase compensation layer PSC may be arranged to overlap each other. For example, the connection line CWL and the phase compensation layer PSC may be patterned using a same mask to have the same shape in the plan view.

In an embodiment, the phase compensation layer PSC may be arranged under the connection line CWL. For example, the phase compensation layer PSC may be arranged between the interlayer insulating layer 115 and the connection line CWL.

As described above, as the phase compensation layer PSC is provided, the performance degradation of the electronic component 40 (see FIG. 2) located in the second display area DA2 may be prevented. This will be described below in more detail with reference to FIG. 6.

Referring to FIG. 6, the phase compensation layer PSC may overlap the connection line CWL in a plan view and may be arranged under the connection line CWL. In an embodiment, the phase compensation layer (PSC) may include an inorganic insulating material. For example, the phase compensation layer PSC may include at least one of silicon oxide (SiO$_2$), silicon nitride (SiN$_x$), and silicon carbonitride (SiCN).

In an embodiment, a refractive index n1 of the connection line CWL may be higher than a refractive index n0 of the first organic insulating layer 117. Herein, the refractive index may refer to a relative refractive index. The refractive index n0 of the first organic insulating layer 117 may be about 1.4 to about 1.8 for a wavelength of about 550 nm. For example, the refractive index n0 of the first organic insulating layer 117 may be about 1.65. The refractive index n1 of the connection line CWL may be about 1.8 to about 2.2 for a wavelength of about 550 nm. For example, the refractive index n1 of the connection line CWL may be about 1.91.

In an embodiment, a refractive index n2 of the phase compensation layer PSC may be lower than the refractive index n0 of the first organic insulating layer 117. The refractive index n2 of the phase compensation layer PSC may be about 1.3 to about 1.8 for a wavelength of about 550 nm. For example, the refractive index n2 of the phase compensation layer PSC may be about 1.47.

Among the lights passing through the second display area DA2, a first light L1 may pass through an area in which the connection line CWL is arranged, and a second light L2 may pass through an area where the connection line CWL is not arranged. Due to the difference between the refractive index n1 of the connection line CWL and the refractive index n0 of the first organic insulating layer 117 covering the connection line CW, a phase difference may occur between the first light L1 and the second light L2 and a diffraction phenomenon may occur. Due to the diffraction phenomenon, the performance of the electronic component 40 (see FIG. 2.) may be degraded. For example, when the electronic component 40 is an imaging device such as a camera, a problem such as a flare phenomenon may occur due to a diffraction phenomenon due to the phase difference between the first light L1 and the second light L2.

In order to solve this problem, the display apparatus 10 according to an embodiment may include a phase compensation layer PSC overlapping the connection line CWL and having a refractive index n2 lower than the refractive index n0 of the first organic insulating layer 117. The phase compensation layer PSC may compensate for the phase of the first light L1 such that the first light L1 and the second light L2 may have substantially the same phase. That is, the light incident on the second display area DA2 may have substantially the same phase regardless of existence of the connection line CWL in a path of light. Accordingly, the diffraction phenomenon of the light may be reduced and the performance degradation of the electronic component 40 may be prevented.

Moreover, according to an embodiment, when the refractive index n1 of the connection line CWL and the refractive index n2 of the phase compensation layer PSC are different from each other, a thickness t1 of the connection line CWL and a thickness t2 of the phase compensation layer PSC may be different from each other. The thickness t2 of the phase compensation layer PSC may be provided such that the light passing through an area of the second display area DA2 in which the connection line CWL is arranged and the light passing through an area of the second display area DA2 in which the connection line CWL is not arranged have the same phase (or substantially the same phase). That is, the thickness t2 of the phase compensation layer PSC may be determined such that the first light L1 and the second light L2 may have the same phase. For example, the thickness t2 of the phase compensation layer PSC may be provided such that the optical path difference between the first light L1 and the second light L2 may be an integer of the wavelength. For example, when the refractive index n2 of the phase compensation layer PSC is less than the refractive index n1 of the connection line CWL, the thickness t2 of the phase compensation layer PSC may be greater than the thickness t1 of the connection line CWL. In an embodiment, when the connection line CWL has a refractive index n1 of about 1.91 and a thickness t1 of about 500 Å, the diffraction phenomenon may be minimized when the phase compensation layer PSC has a refractive index n2 of about 1.47 and a thickness t2 greater than the thickness t1, for example, about 600 Å to about 800 Å.

Figure 7:
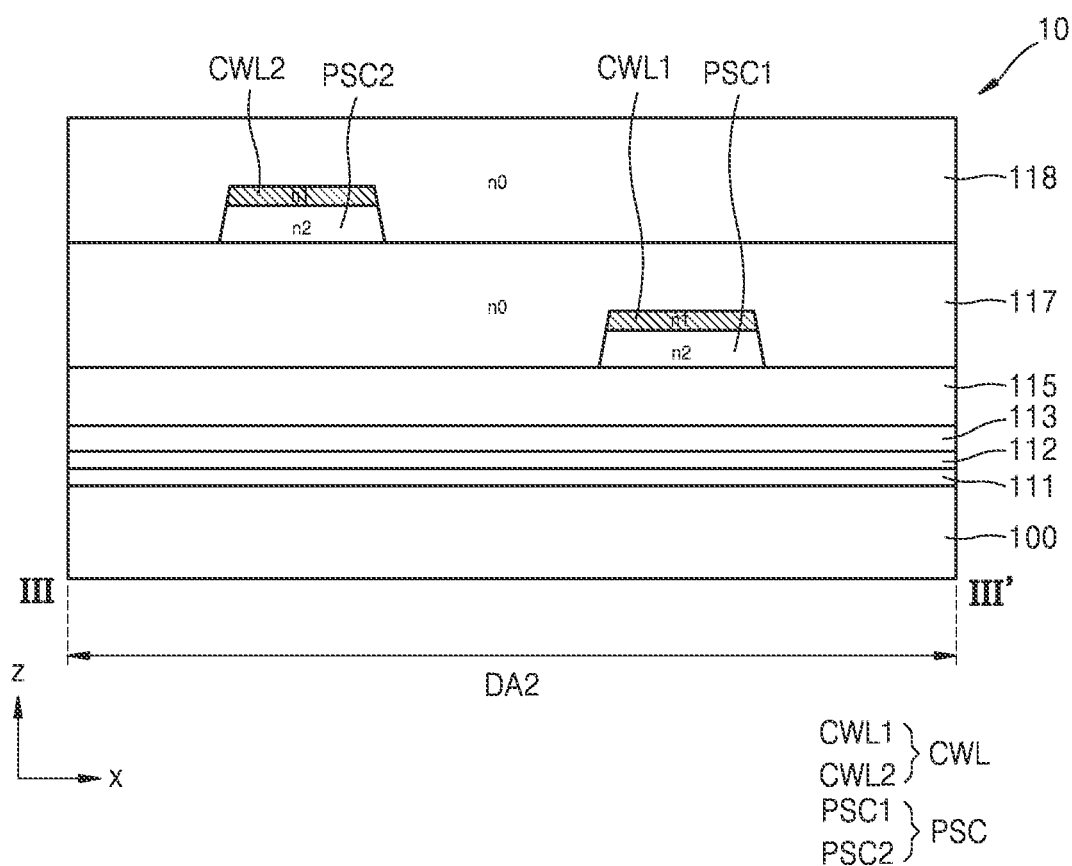
FIG. 7 is a cross-sectional view schematically illustrating a portion of a display apparatus according to other embodiments.

FIG. 7 is a cross-sectional view schematically illustrating a portion of a display apparatus according to other embodiments. The display apparatus of FIG. 7 may be a modification of the display apparatus of FIG. 6. The same reference numerals will be given to the same or similar components as those described above with reference to FIGS. 5 and 6, and thus, differences therebetween will be mainly described below.

Referring to FIG. 7, the connection CWL may include a first connection line CWL1 and a second connection line CWL2 that are arranged on different layers. The phase compensation layer PSC may include a first phase compensation layer PSC1 overlapping the first connection line CWL1 and a second phase compensation layer PSC2 overlapping the second connection line CWL2.

The first connection line CWL1 and the second connection line CWL2 may be arranged on different layers with the first organic insulating layer 117 arranged therebetween. For example, as illustrated in FIG. 7, the first connection line CWL1 may be arranged over the interlayer insulating layer 115, and the second connection line CWL2 may be arranged over the first organic insulating layer 117. In this case, the first phase compensation layer PSC1 may be arranged between the first connection line CWL1 and the interlayer insulating layer 115, and the second phase compensation layer PSC2 may be arranged between the second connection line CWL2 and the first organic insulating layer 117. Also, the first phase compensation layer PSC1 and the second phase compensation layer PSC2 may be respectively arranged under the first connection line CWL1 and the second connection line CWL2 to overlap the first connection line CWL1 and the second connection line CWL2 in a plan view. As such, by arranging the connection line CWL that includes the first connection line CWL1 and the second connection line CWL2 and the phase compensation layer PSC that includes the first phase compensation layer PSC1 and the second phase compensation layer PSC2 on different layers, high integration may be achieved.

Moreover, each of the first connection line CWL1 and the second connection line CWL2 may include the transparent conductive oxide (TCO) described above. Each of the first phase compensation layer PSC1 and the second phase compensation layer PSC2 may include an inorganic insulating material, and for example, the phase compensation layer PSC may include at least one of silicon oxide ($SiO_2$), silicon nitride ($SiN_x$), and silicon carbonitride (SiCN).

For example, the first organic insulating layer 117 and the second organic insulating layer 118 may have the same refractive index (n0). As another example, the first organic insulating layer 117 and the second organic insulating layer 118 may have different refractive indexes. Hereinafter, for convenience of description, a case where the first organic insulating layer 117 and the second organic insulating layer 118 have the same refractive index (n0) will be described.

In an embodiment, the refractive index n1 of the first connection line CWL1 may be higher than the refractive index n0 of the first organic insulating layer 117. The refractive index n2 of the first phase compensation layer PSC1 may be lower than the refractive index n0 of the first organic insulating layer 117. Also, the refractive index n1 of the second connection line CWL2 may be higher than the refractive index n0 of the second organic insulating layer 118. The refractive index n2 of the second phase compensation layer PSC2 may be lower than the refractive index n0 of the second organic insulating layer 118.

Figure 8:
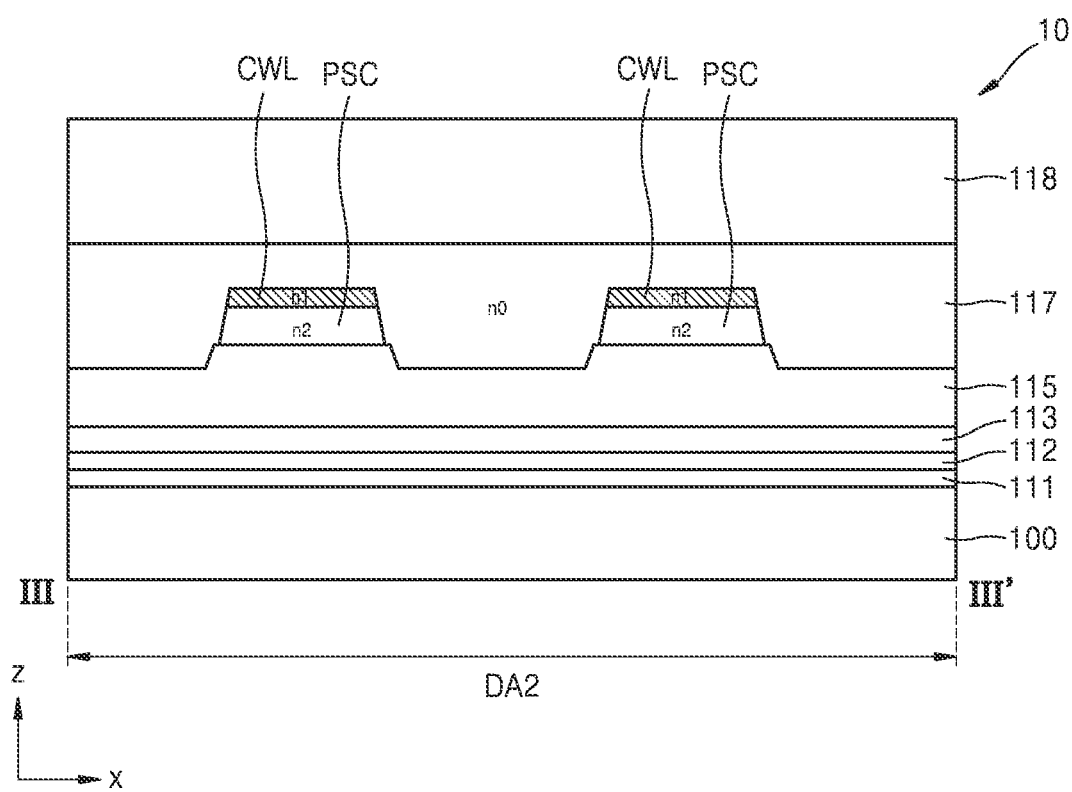
FIG. 8 is a cross-sectional view schematically illustrating a portion of a display apparatus according to other embodiments.

FIG. 8 is a cross-sectional view schematically illustrating a portion of a display apparatus according to other embodiments. The display apparatus of FIG. 8 may be a modification of the display apparatus of FIG. 6. The same reference numerals will be given to the same or similar components as those described above with reference to FIGS. 5 and 6, and thus, differences therebetween will be mainly described below.

Figure 9:
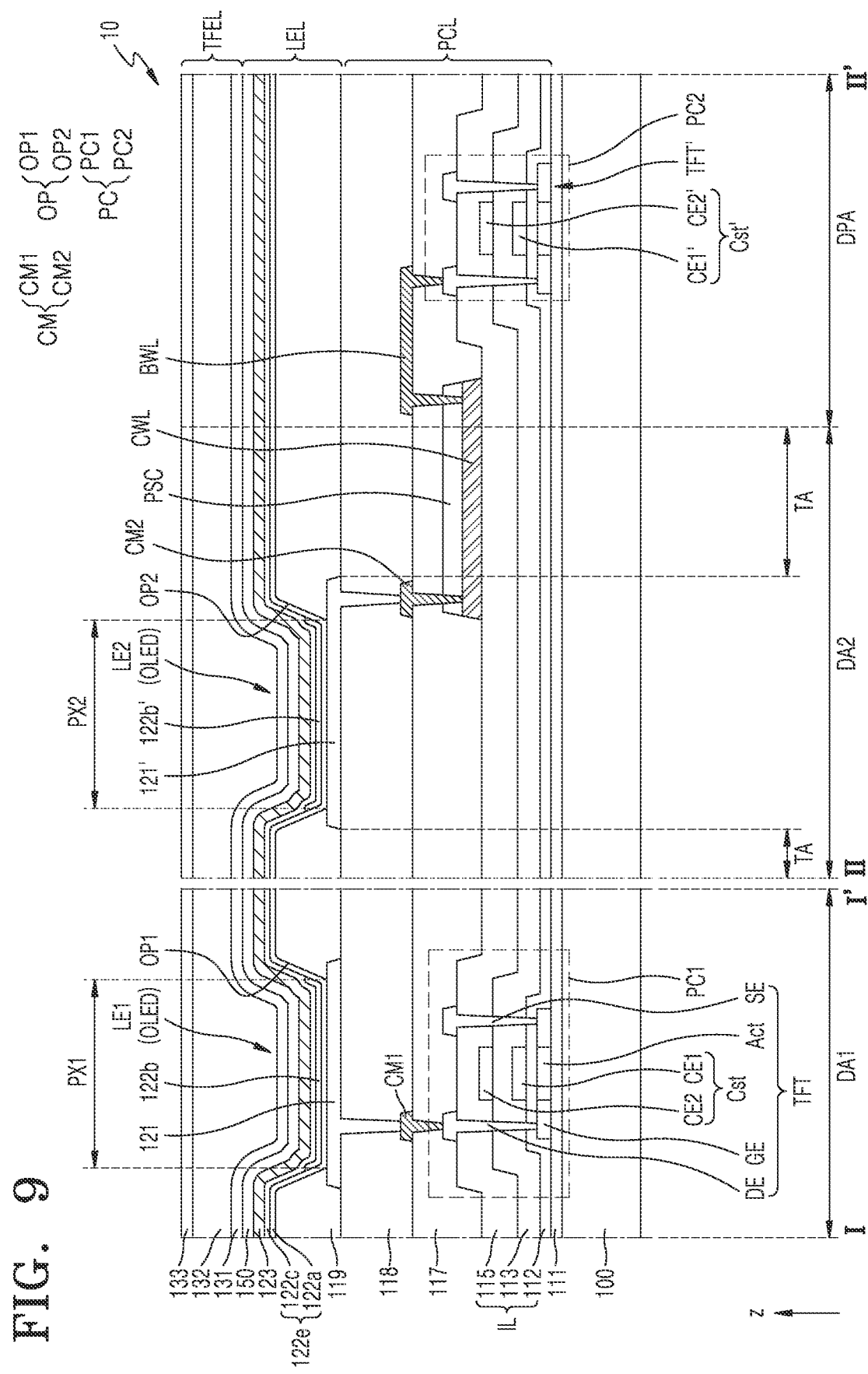
FIG. 9 is a cross-sectional view schematically illustrating a portion of a display apparatus according to other embodiments.

Referring to FIG. 8, the upper surface of an insulating layer over which the connection line CWL and the phase compensation layer PSC are arranged may not be flat. For example, as illustrated in FIG. 8, the upper surface of the interlayer insulating layer 115 may not be flat. Thus, the thickness of a portion overlapping the connection line CWL and the phase compensation layer PSC may be different from the thickness of a portion not overlapping the connection line CWL and the phase compensation layer PSC. For example, the thickness of a portion overlapping the connection line CWL and the phase compensation layer PSC may be greater than the thickness of a portion not overlapping the connection line CWL and the phase compensation layer PSC FIG. 9 is a cross-sectional view schematically illustrating a portion of a display apparatus according to other embodiments. The display apparatus of FIG. 9 may be a modification of the display apparatus of FIG. 5. Redundant descriptions already given above with reference to FIGS. 5 and 6 will be omitted, and differences therebetween be mainly described below.

Referring to FIG. 9, the phase compensation layer PSC may overlap the connection line CWL and may be arranged over the connection line CWL. In this case, the connection line CWL may be arranged between the phase compensation layer PSC and the interlayer insulating layer 115. The second contact metal CM2 may be connected to one end of the connection line CWL through a contact hole formed in the first organic insulating layer 117 and the phase compensation layer PSC. The bridge line BWL may be connected to the other end of the connection line CWL through a contact hole formed in the first organic insulating layer 117 and the phase compensation layer PSC.

Figure 10:
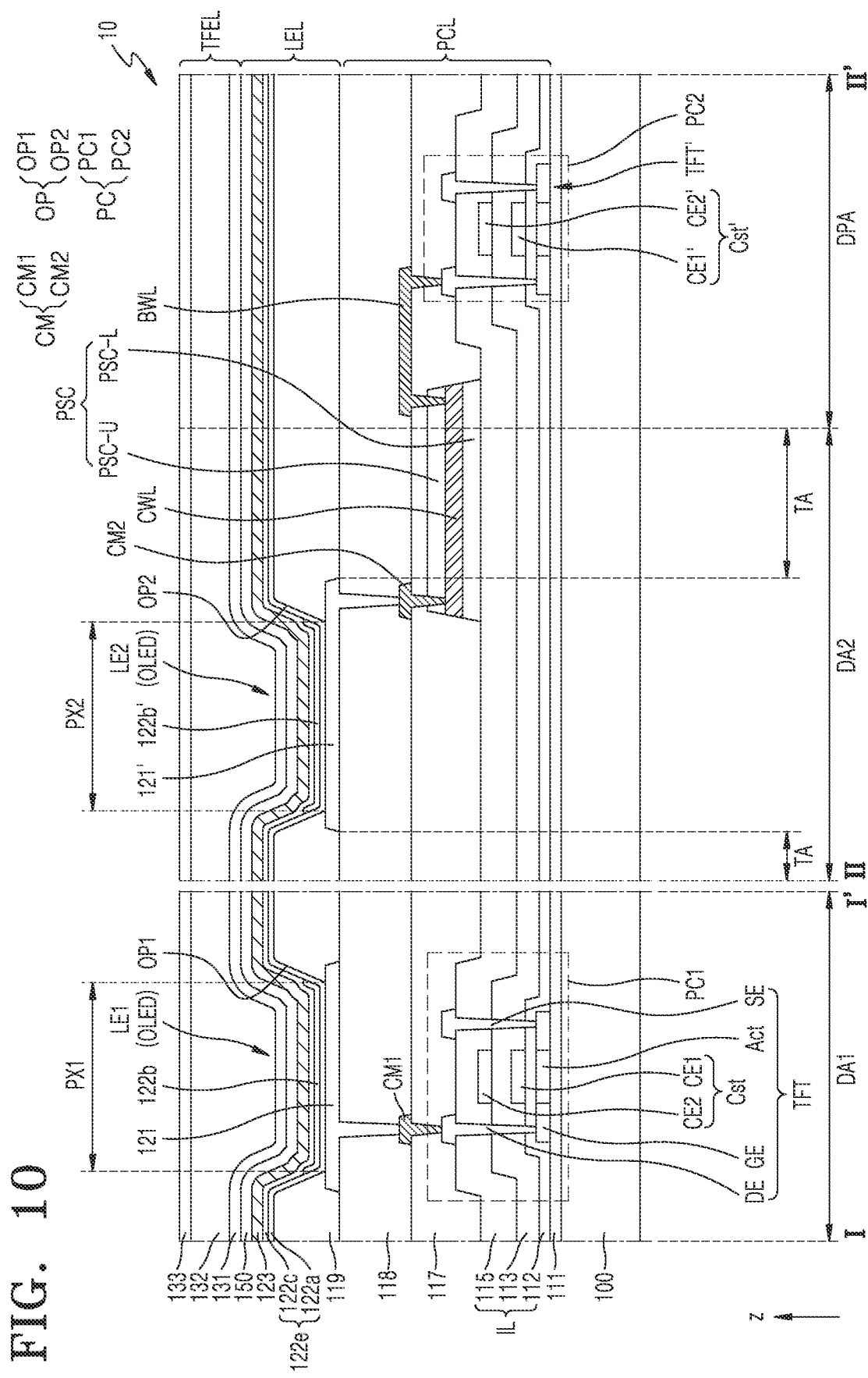
FIG. 10 is a cross-sectional view schematically illustrating a portion of a display apparatus according to other embodiments.

FIG. 10 is a cross-sectional view schematically illustrating a portion of a display apparatus according to other embodiments. The display apparatus of FIG. 10 may be a modification of the display apparatus of FIG. 7. Redundant descriptions already given above with reference to FIGS. 5 and 6 will be omitted, and differences therebetween will be mainly described below.

Referring to FIG. 10, the phase compensation layer PSC may include a lower phase compensation layer PSC-L located under the connection line CWL and an upper phase compensation layer PSC-U located over the connection line CWL. That is, the connection line CWL may be arranged between the lower phase compensation layer PSC-L and the upper phase compensation layer PSC-U. The second contact metal CM2 may be connected to one end of the connection line CWL through a contact hole formed in the upper phase compensation layer PSC-U and the first organic insulating layer 117, and the bridge line BWL may be connected to the other end of the connection line CWL through a contact hole formed in the upper phase compensation layer PSC-U and the first organic insulating layer 117.

In an embodiment, the lower phase compensation layer PSC-L and the upper phase compensation layer PSC-U may include an inorganic insulating material and, for example, the phase compensation layer PSC may include at least one of silicon oxide ($SiO_2$), silicon nitride ($SiN_x$), and silicon carbonitride (SiCN).

In some embodiments, the lower phase compensation layer PSC-L and the upper phase compensation layer PSC-U may include the same material and may have the same refractive index. In some embodiments, the lower phase compensation layer PSC-L and the upper phase compensation layer PSC-U may have the same thickness or different thicknesses. However, the disclosure is not limited thereto, and the material, refractive index, and thickness of each of the lower phase compensation layer PSC-L, and the upper phase compensation layer PSC-U may be modified without departing from the scope of the disclosure.

Figure 11:
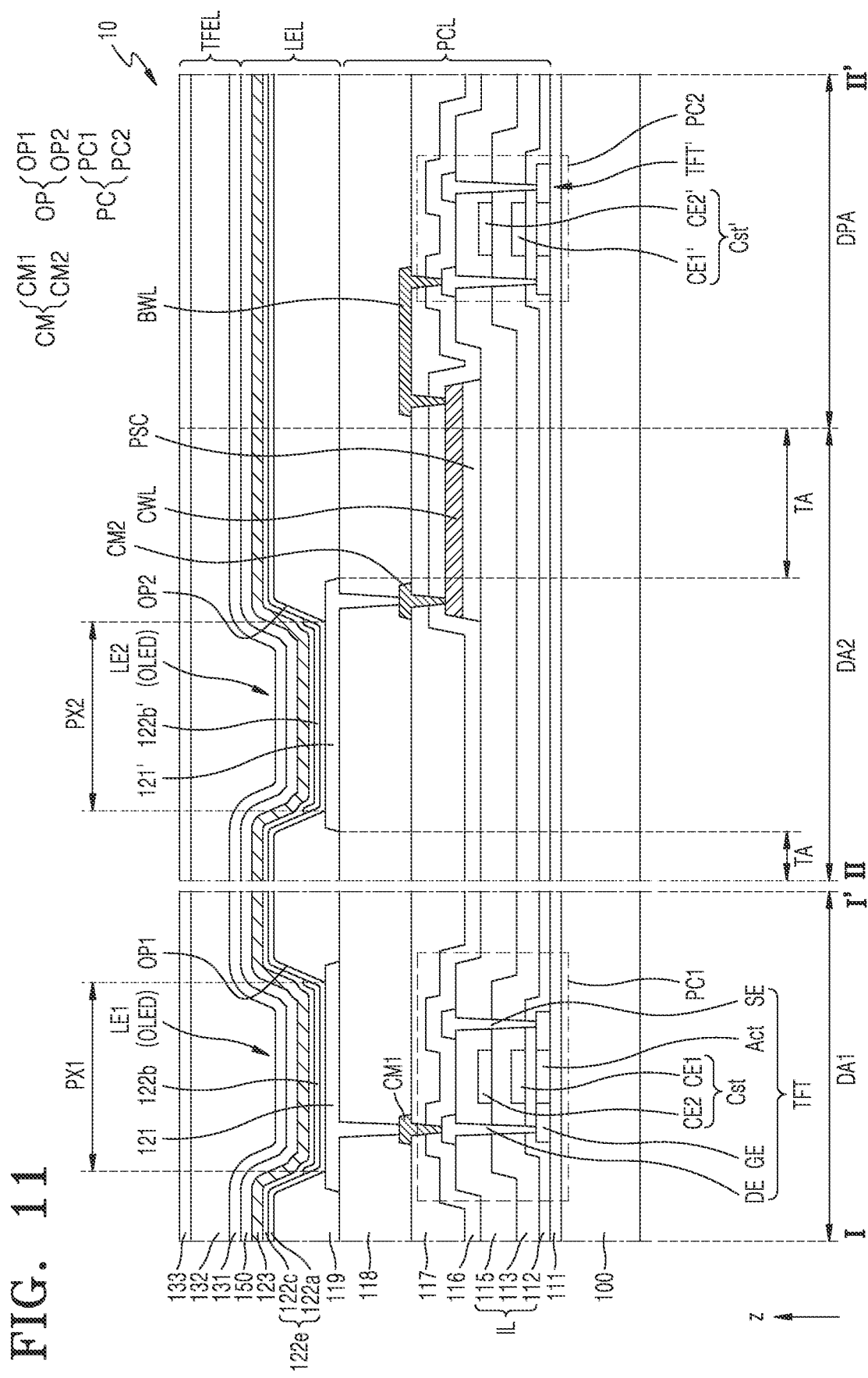
FIGS. 11 and 12 are cross-sectional views schematically illustrating a portion of a display apparatus according to other embodiments.
Figure 12:
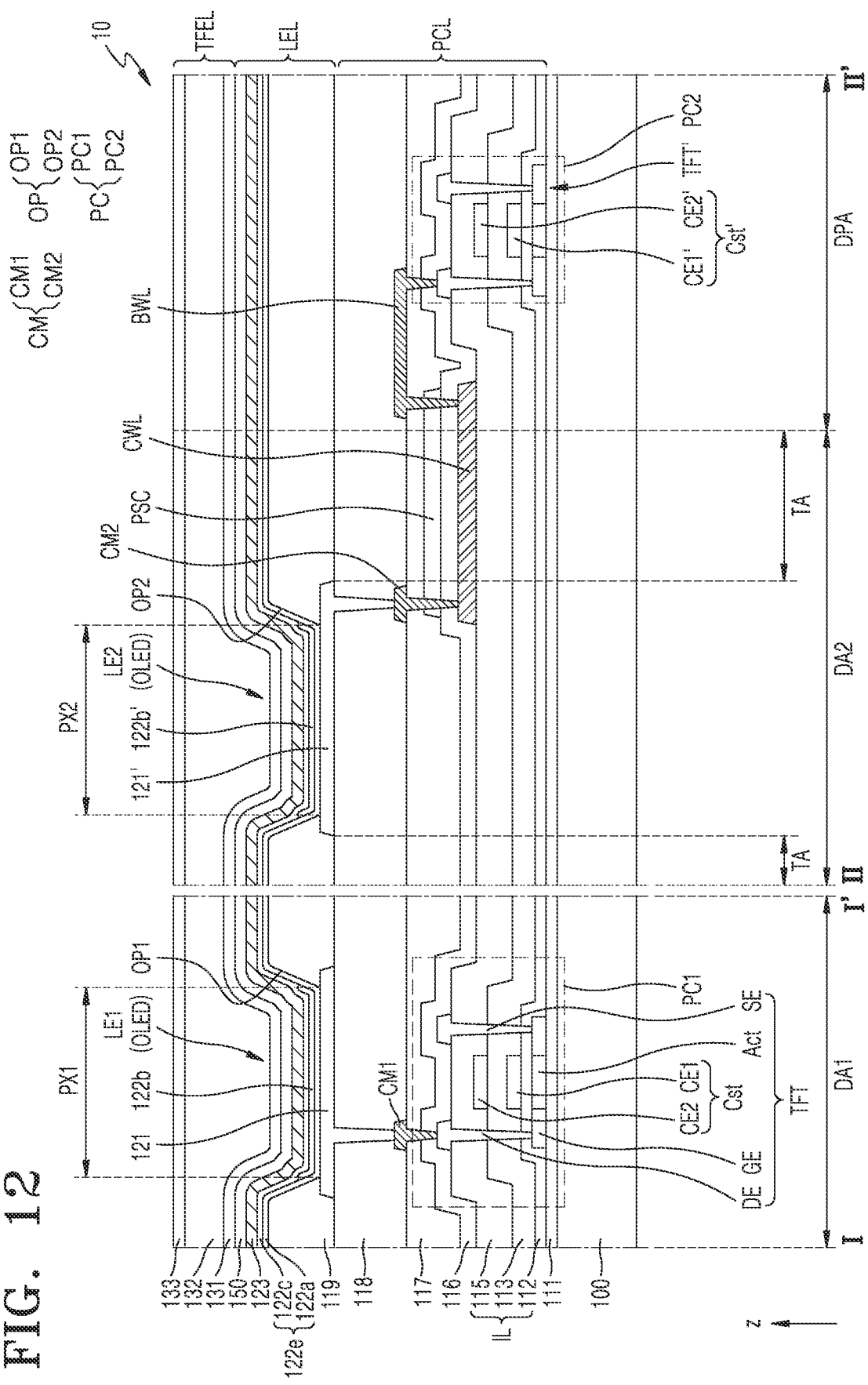

FIGS. 11 and 12 are cross-sectional views schematically illustrating a portion of a display apparatus according to other embodiments. The display apparatus of each of FIGS. 11 and 12 may be a modification of the display apparatus of FIG. 5. Redundant descriptions already given above with reference to FIGS. 5 and 6 will be omitted, and differences therebetween will be mainly described below.

Referring to FIGS. 11 and 12 the display apparatus 10 may further include an inorganic insulating layer 116. In an embodiment, as illustrated in FIG. 11, the display apparatus 10 may further include an inorganic insulating layer 116 covering the connection line CWL and the phase compensation layer PSC. In other embodiments, as illustrated in FIG. 12, the inorganic insulating layer 116 may be arranged between the connection line CWL and the phase compensation layer PSC. The inorganic insulating layer 116 may protect the connection line CWL. The inorganic insulating layer 116 may include a contact hole for electrical connection between the connection line CWL and the second contact metal CM2 and between the connection line CWL and the bridge line BWL.

In an embodiment, the inorganic insulating layer 116 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The inorganic insulating layer 116 may have a single-layer structure as illustrated in FIG. 11 or may have a multiple-layer structure.

Figure 13:
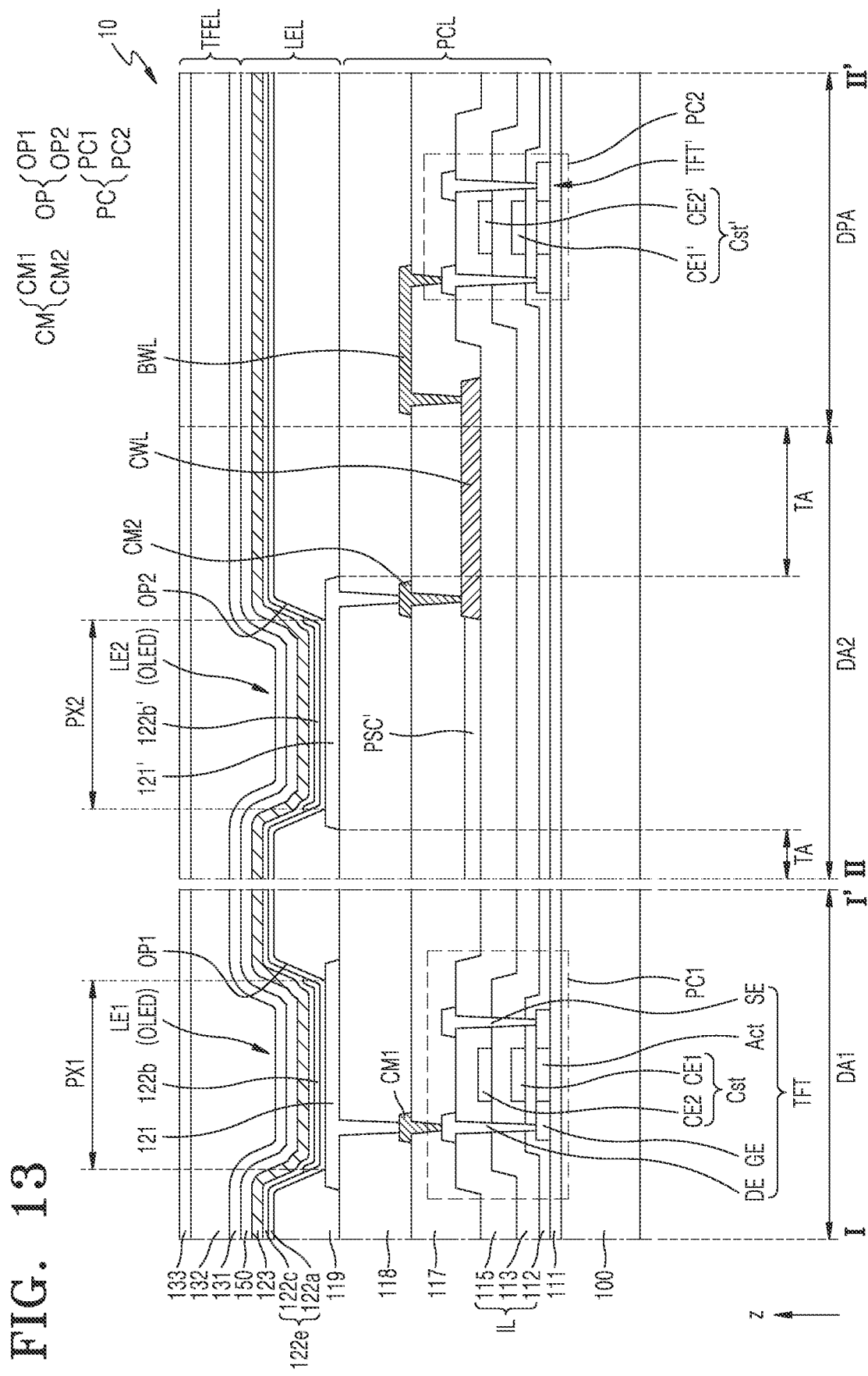
FIG. 13 is a cross-sectional view schematically illustrating a portion of a display apparatus according to other embodiments.

FIG. 13 is a cross-sectional view schematically illustrating a portion of a display apparatus according to other embodiments. The same reference numerals will be given to the same or similar components as those described above with reference to FIG. 5, and thus, redundant descriptions thereof will be omitted and differences therebetween will be mainly described below.

Referring to FIG. 13, a phase compensation layer PSC' may be arranged in the second display area DA2 and may not overlap the connection line CWL in the plan view. That is, in a view in a direction perpendicular to one surface of the substrate 100, the connection line CWL and the phase compensation layer PSC' may be arranged not to overlap each other.

In an embodiment, the phase compensation layer PSC' may be arranged on the same layer as the connection line CWL. For example, both the phase compensation layer PSC' and the connection line CWL may be arranged over the upper surface of the interlayer insulating layer 115.

Figure 14:
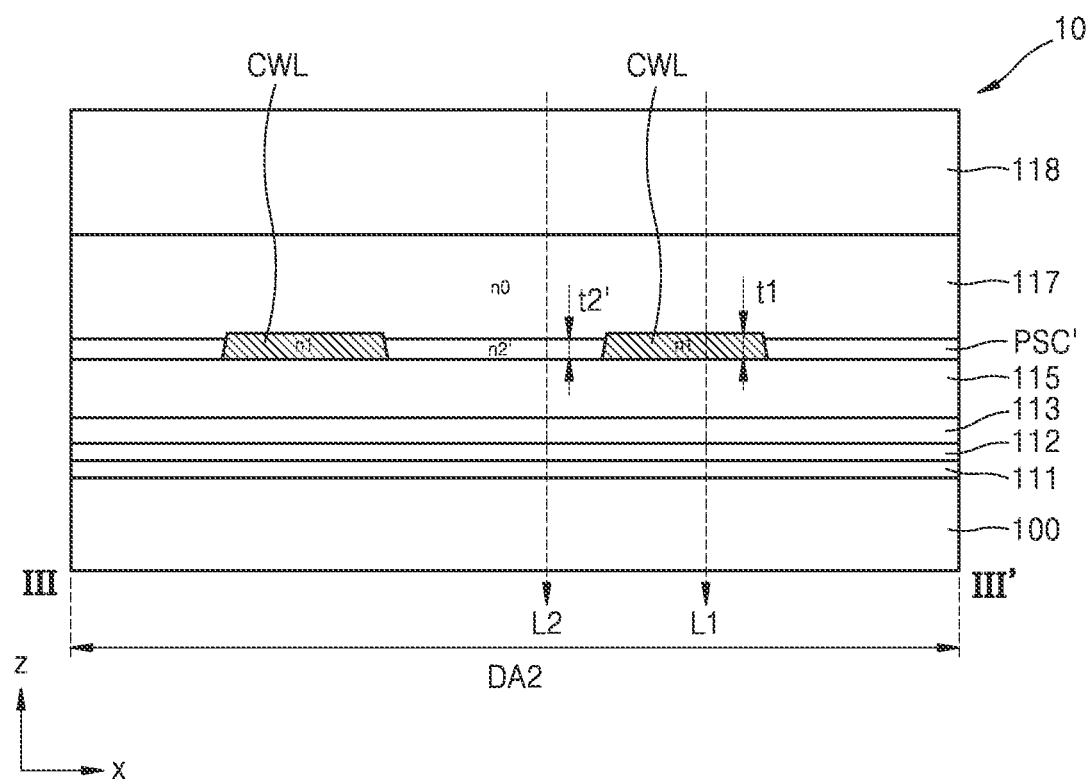
FIG. 14 is a cross-sectional view schematically illustrating a portion of a display apparatus according to other embodiments.

FIG. 14 is a cross-sectional view schematically illustrating a portion of a display apparatus according to other embodiments. The same reference numerals will be given to the same or similar components as those described above with reference to FIG. 6, and thus, redundant descriptions thereof will be omitted and differences therebetween will be mainly described below Referring to FIG. 14, the phase compensation layer PSC' may not overlap the connection line CWL and may be arranged on the same layer as the connection line CWL. In an embodiment, the phase compensation layer PSC' may include an inorganic insulating material and may include, for example, at least one of silicon nitride ($SiN_x$) and silicon oxynitride (SiON).

In an embodiment, a refractive index n1 of the connection line CWL may be higher than a refractive index n0 of the first organic insulating layer 117. The refractive index n0 of the first organic insulating layer 117 may be about 1.4 to about 1.8 for a wavelength of about 550 nm. For example, the refractive index n0 of the first organic insulating layer 117 may be about 1.65. The refractive index n1 of the connection line CWL may be about 1.8 to about 2.2 for a wavelength of about 550 nm. For example, the refractive index of the connection line CWL may be about 1.91.

In an embodiment, a refractive index n2' of the phase compensation layer PSC' may be higher than the refractive index n0 of the first organic insulating layer 117. The refractive index n2' of the phase compensation layer PSC' may be about 1.6 to about 2.2 for a wavelength of about 550 nm. For example, the refractive index n2' of the phase compensation layer PSC' may be about 1.93.

Among the light passing through the second display area DA2, a first light L1 may pass through an area in which the connection line CWL is arranged, and a second light L2 may pass through an area where the connection line CWL is not arranged. As described above, due to the difference between the refractive index n1 of the connection line CWL and the refractive index n0 of the first organic insulating layer 117 covering the connection line CW, a phase difference may occur between the first light L1 and the second light L2 and thus a diffraction phenomenon may occur. The phase compensation layer PSC' may compensate for the phase of the second light L2 such that the first light L1 and the second light L2 may have substantially the same phase. Accordingly, the diffraction phenomenon of the light incident on the second display DA2 may be prevented or minimized, and the performance degradation of the electronic component 40 may be prevented.

Moreover according to an embodiment, when the refractive index n1 of the connection line CWL and the refractive index n2' of the phase compensation layer PSC' are different from each other, a thickness t1 of the connection line CWL, and a thickness t2' of the phase compensation layer PSC' may be different from each other. The thickness t2' of the phase compensation layer PSC' may be determined such that the first light L1 and the second light L2 may have the same phase. For example, the thickness t2' of the phase compensation layer PSC' may be provided such that the optical path difference between the first light L1 and the second light L2 may be an integer multiple of the wavelength. For example, when the refractive index n2' of the phase compensation layer PSC' is greater than the refractive index n1 of the connection line CWL, the thickness t2' of the phase compensation layer PSC' may be less than the thickness t1 of the connection line CWL. In an embodiment, when the connection line CWL has a refractive index n1 of about 1.91 and a thickness t1 of about 500 Å, the diffraction phenomenon may be minimized when the phase compensation layer PSC' has a refractive index n2 of about 1.93 and a thickness t2' less than the thickness t1 of the connection line CWL, for example, about greater than or equal to 400 Å to about less than 500 Å.

Figure 15:
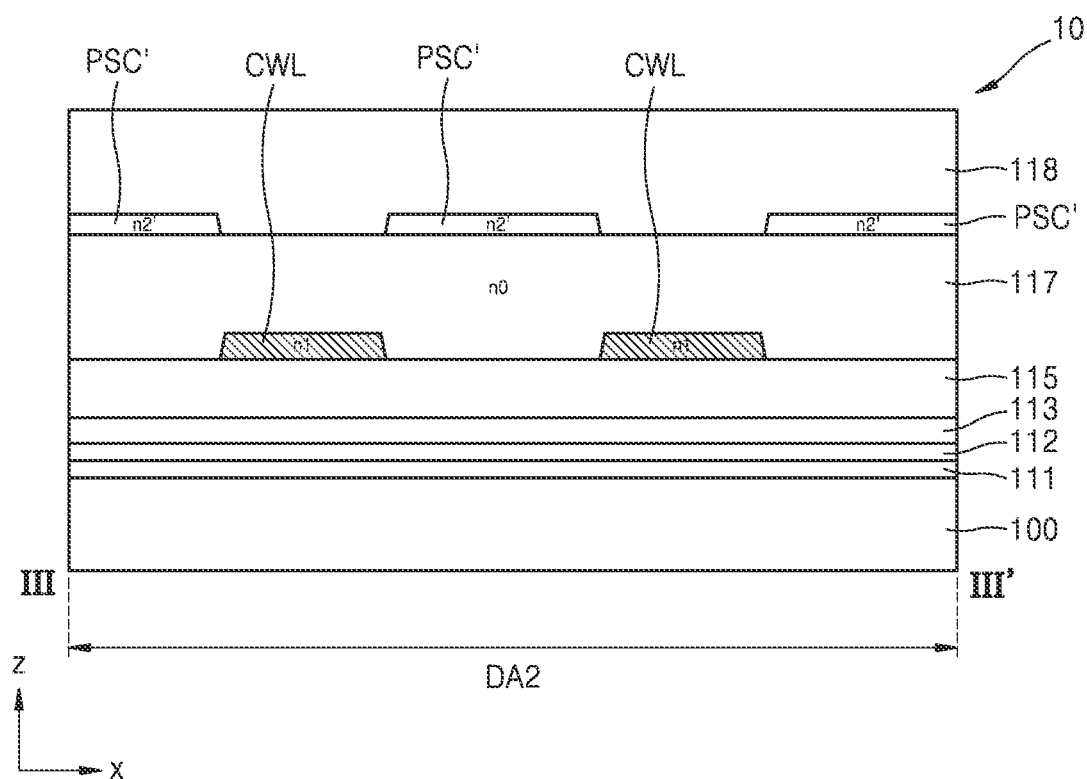
FIGS. 15 and 16 are cross-sectional views schematically illustrating a portion of a display apparatus according to other embodiments.
Figure 16:
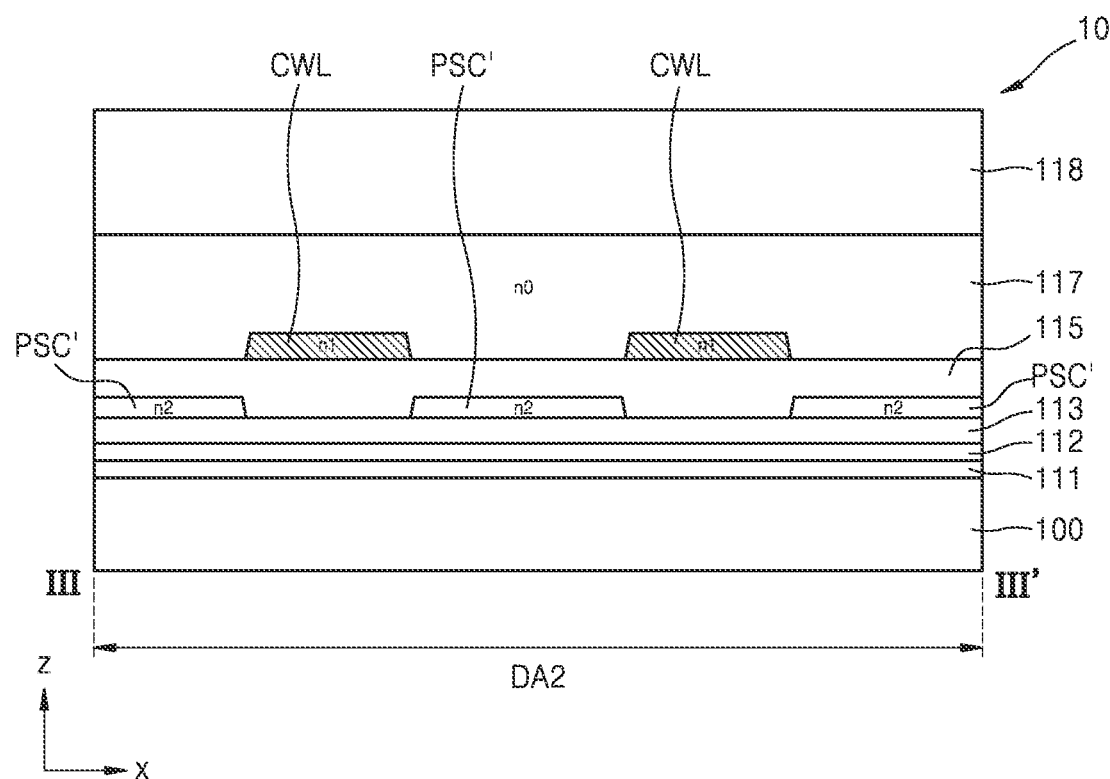

FIGS. 15 and 16 are cross-sectional views schematically illustrating a portion of a display apparatus according to other embodiments. The display apparatuses of FIGS. 15 and 16 are modifications of the display apparatus of FIG. 14, redundant descriptions already given above with reference to FIG. 14 will be omitted, and differences therebetween will be mainly described below.

Referring to FIGS. 15 and 16, the phase compensation layer PSC' may be arranged on a different layer than the connection line CWL. As illustrated in FIG. 15, the connection line CWL may be arranged between the interlayer insulating layer 115 and the first organic insulating layer 117, while the phase compensation layer PSC' may be arranged between the first organic insulating layer 117 and the second organic insulating layer 118 not to overlap a center portion of the connection line CWL. Alternatively, as illustrated in FIG. 16, the connection line CWL may be arranged between the interlayer insulating layer 115 and the first organic insulating layer 117, while the phase compensation layer PSC' may be arranged between the second gate insulating layer 113 and the interlayer insulating layer 115 not to overlap a center portion of the connection line CWL. As such, the stack relationship thereof may be variously modified as long as the phase compensation layer PSC' and the connection line CWL are arranged not to overlap each other. Edges of the connection line CWL and the phase compensation layer PSC may overlap each other in a plan view.

FIGS. 17A to 17E are cross-sectional views schematically illustrating a process of manufacturing a display apparatus according to an embodiment.

Figure 17A:
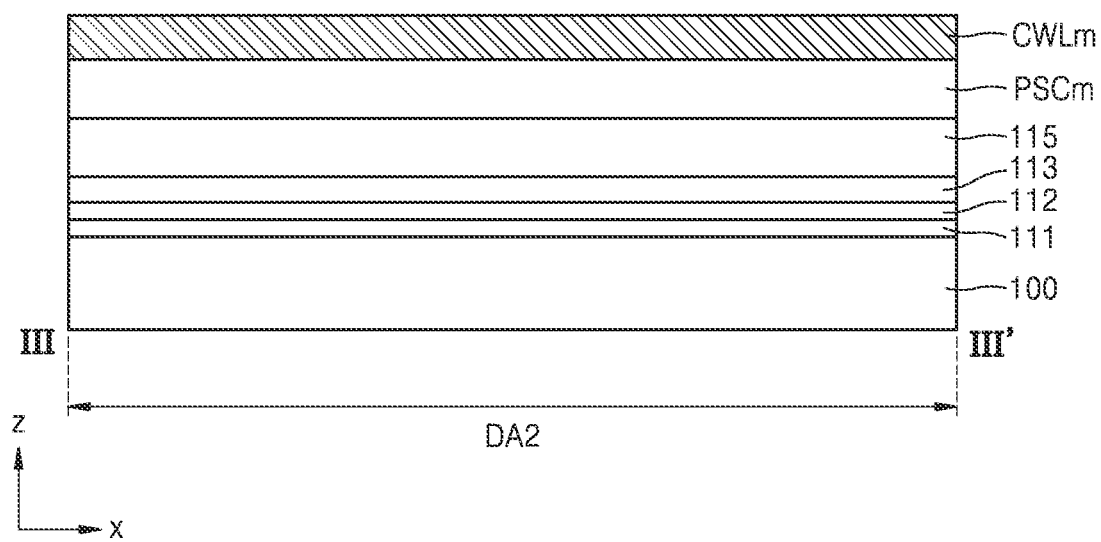
FIGS. 17A, 17B, 17C, 17D, 17E and 17E are cross-sectional views schematically illustrating a process of manufacturing a display apparatus according to an embodiment.

Referring to FIG. 17A, a phase compensation layer-material layer PSCm at least partially arranged in a second display area DA2 may be formed over an interlayer insulating layer 115. Also, a connection line-material layer CWLm at least partially arranged in the second display area DA2 may be formed over the interlayer insulating layer 115. Although FIG. 17A illustrates that the connection line-material layer CWLm is formed over the phase compensation layer-material layer PSCm, the formation order thereof may be reversed.

The phase compensation layer-material layer PSCm and the connection line-material layer CWLm may be formed through a coating process or a deposition process or the like. Here, for example, a method such as spin coating may be used in the coating process, and chemical vapor deposition (CVD) such as thermal chemical vapor deposition (TCVD), plasma enhanced chemical vapor deposition (PECVD), or atmospheric pressure chemical vapor deposition (APCVD), or physical vapor deposition (PVD) such as thermal evaporation, sputtering, or e-beam evaporation may be used in the deposition process.

Figure 17B:
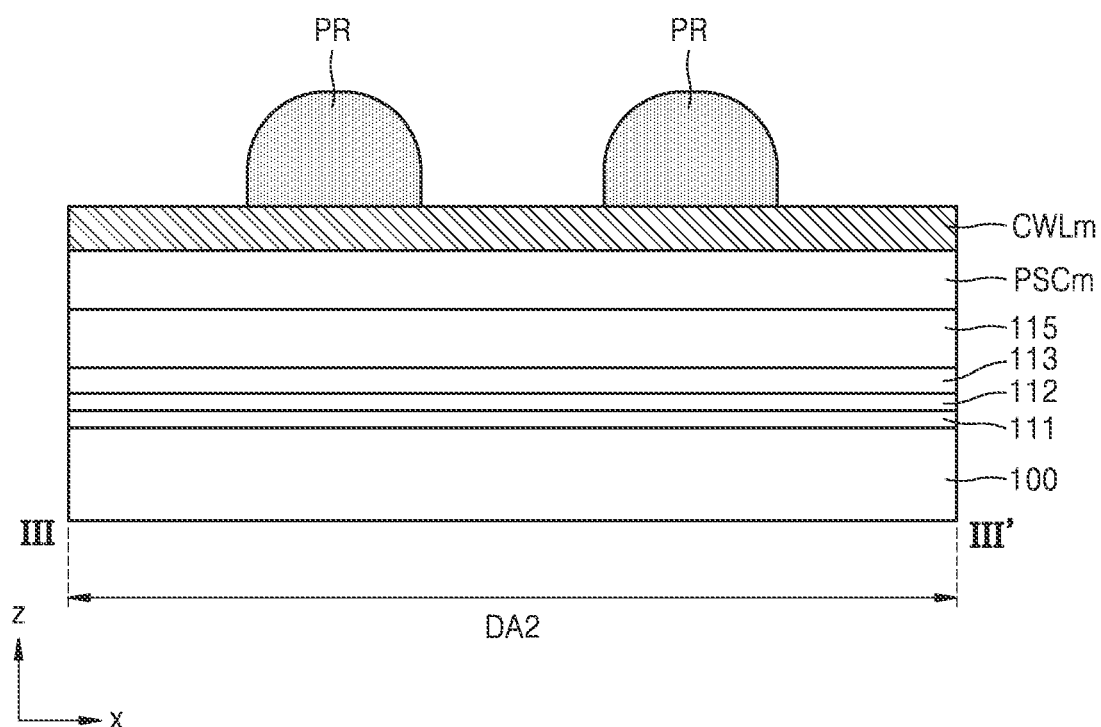

Referring to FIG. 17B, a photoresist pattern layer PR may be formed over the phase compensation layer-material layer PSCm and the connection line-material layer CWLm. The photoresist pattern layer PR, may be formed by exposing and developing a photoresist through a photomask.

Figure 17C:
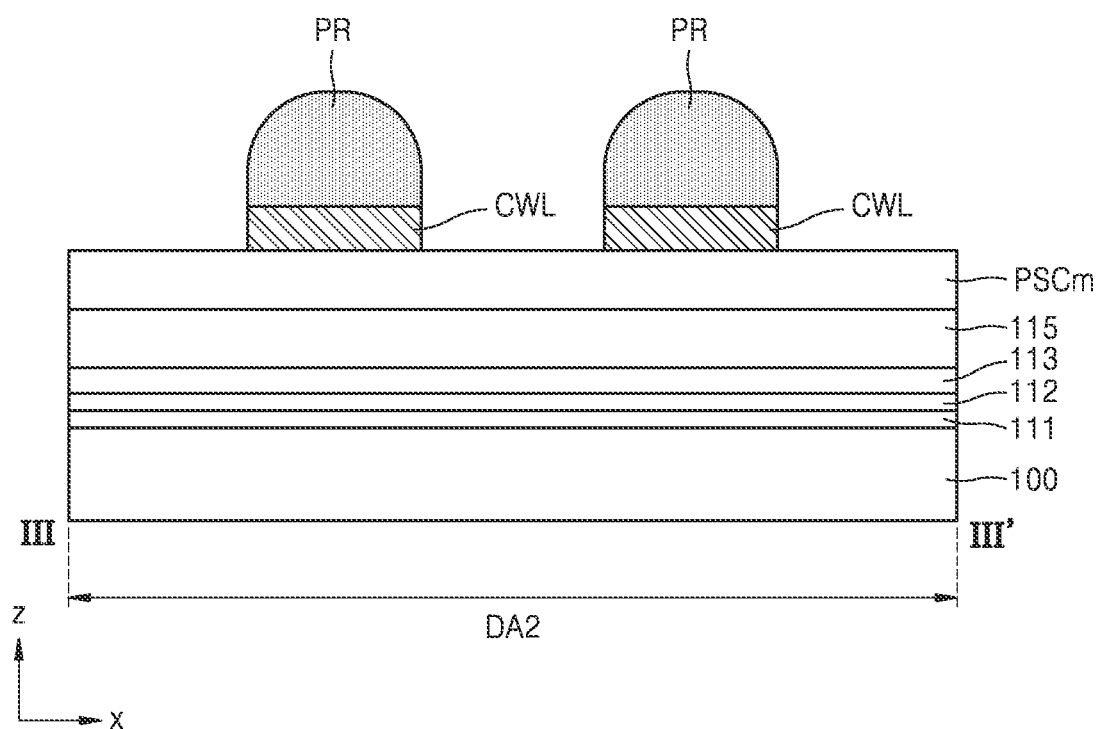

Referring to FIG. 17C, a connection line CWL may be formed by patterning the connection line-material layer CWLm by using the photoresist pattern layer PR as a mask. In this case, an etching process may be used for patterning, for example, dry etching or wet etching may be used.

Figure 17D:
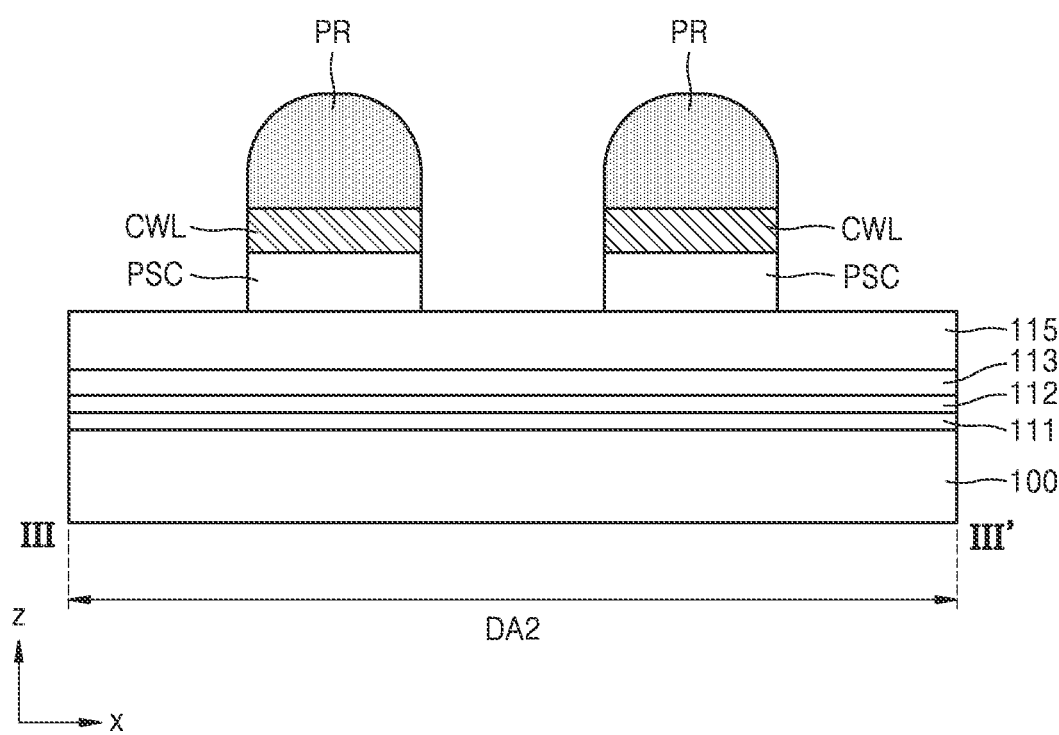

Subsequently, referring to FIG. 17D, a phase compensation layer PSC may be formed by patterning the phase compensation layer-material layer PSCm by using the photoresist pattern layer PR and the patterned connection line CWL as a mask. In this case, an etching process may be used for patterning, for example, dry etching or wet etching may be used.

Figure 17E:
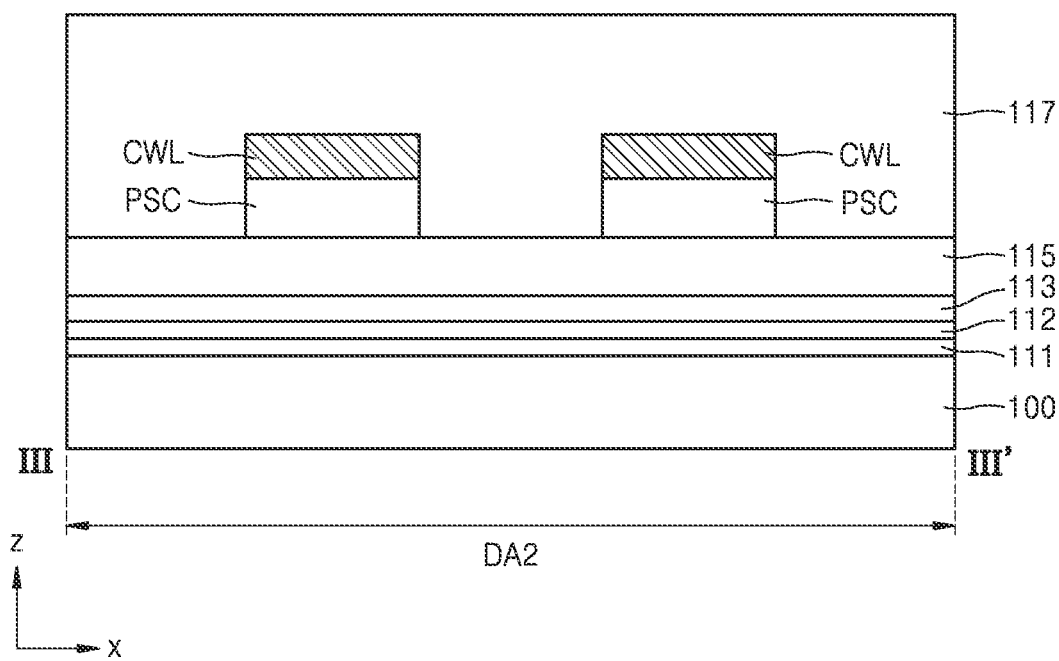

Next, referring to FIG. 17E, the photoresist pattern layer PR may be removed, and a first organic insulating layer 117 may be formed over the interlayer insulating layer 115 to cover the phase compensation layer PSC and the connection line CWL.

As such, because the connection line CWL and the phase compensation layer PSC overlapping the connection line CWL may be formed by using one photoresist pattern layer PR, misalignment between the connection line CWL and the phase compensation layer PSC may be minimized and thus the phase compensation effect thereof may be maximized. Also, both the connection line CWL and the phase compensation layer PSC may be formed without addition of a mask process.

FIGS. 18A to 18F are cross-sectional views schematically illustrating a process of manufacturing a display apparatus according to other embodiments.

Figure 18A:
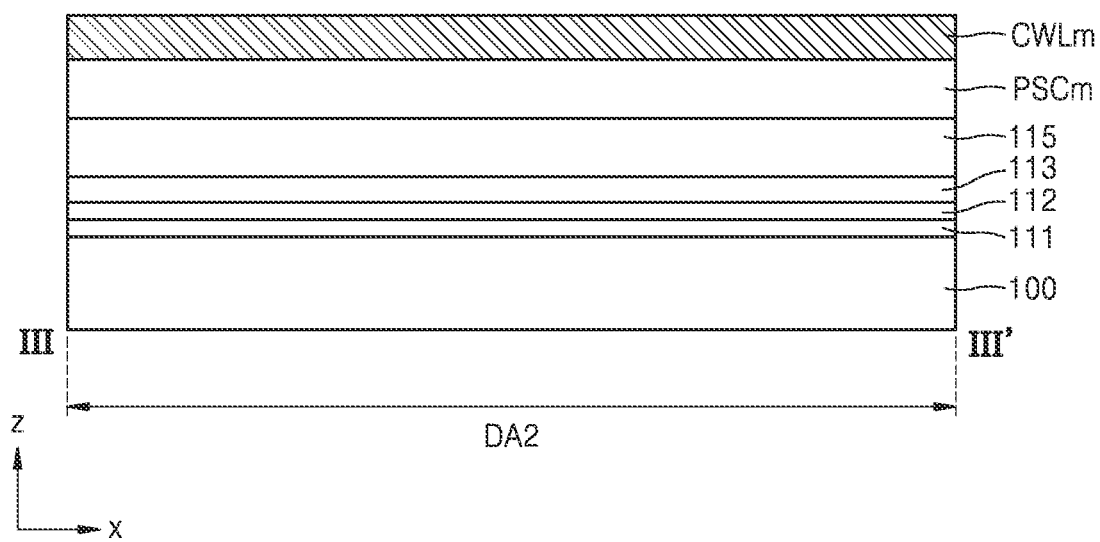
FIGS. 18A, 18B, 18C, 18D, 18E and 18F are cross-sectional views schematically illustrating a process of manufacturing a display apparatus according to other embodiments.

Referring to FIG. 18A, a phase compensation layer-material layer PSCm at least partially arranged in a second display area DA2 may be formed over an interlayer insulating layer 115. Also, a connection line-material layer CWLm at least partially arranged in the second display area DA2 may be formed over the interlayer insulating layer 115.

Figure 18B:
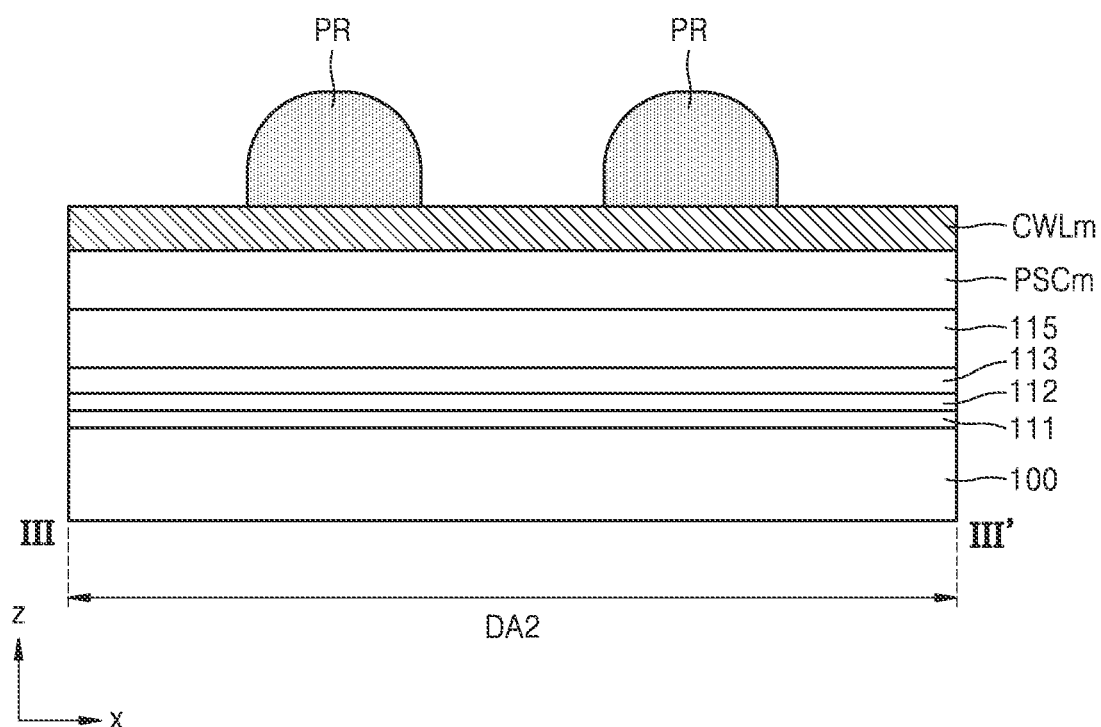

Referring to FIG. 18B, a photoresist pattern layer PR may be formed over the phase compensation layer-material layer PSCm and the connection line-material layer CWLm. The photoresist pattern layer PR may be formed by exposing and developing a photoresist through a photomask.

Figure 18C:
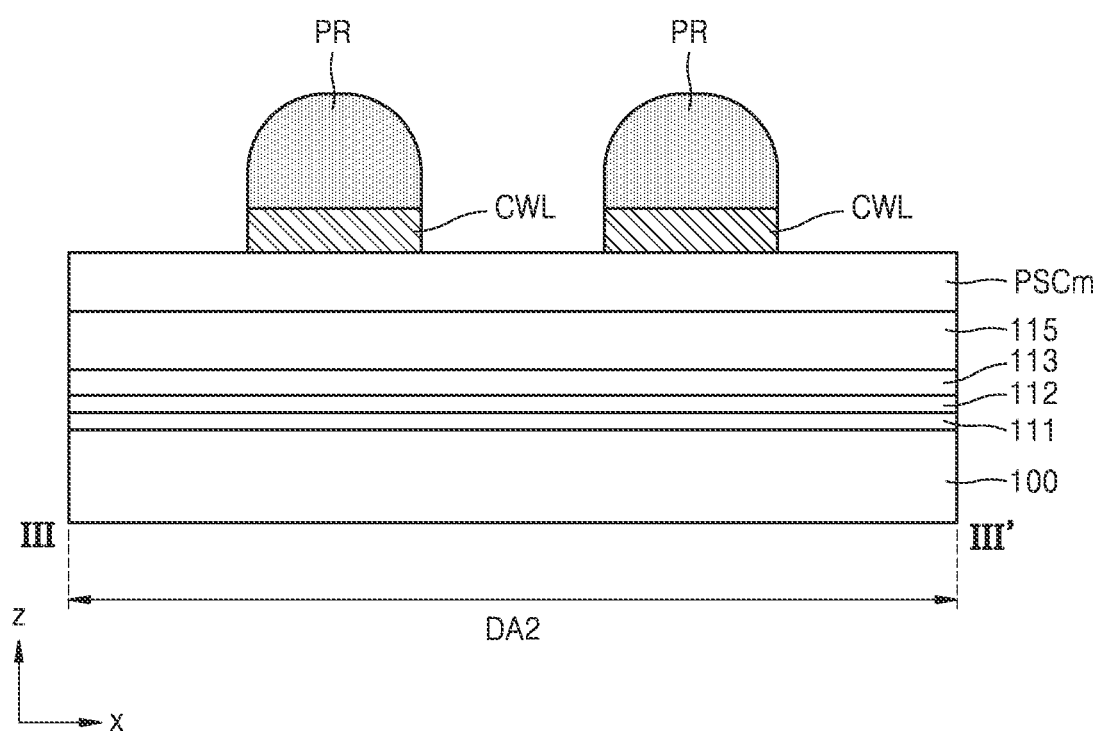

Referring to FIG. 18C, a connection line CWL may be formed by patterning the connection line-material layer CWLm by using the photoresist pattern layer PR as a mask. In this case, an etching process may be used for patterning, for example, dry etching or wet etching may be used.

Figure 18D:
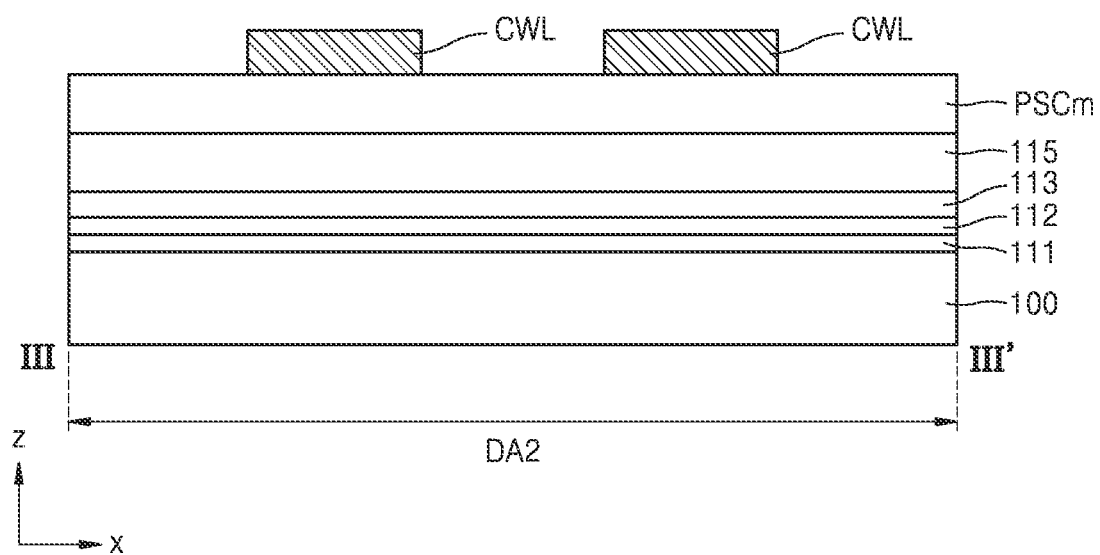

Subsequently, referring to FIG. 18D, the photoresist pattern layer PR may be removed. In this case, a strip process or an asking process using plasma may be used.

Figure 18E:
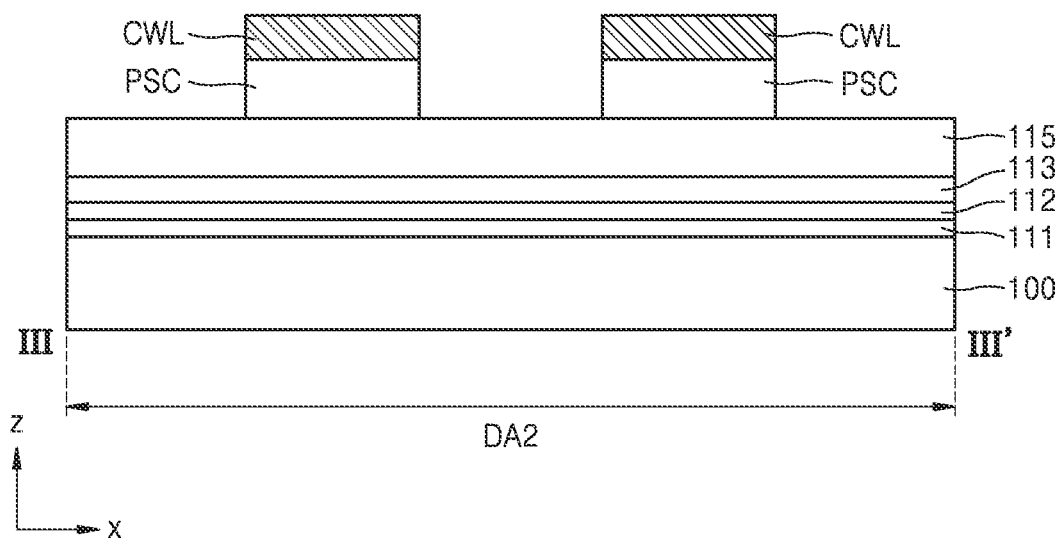

Next, referring to FIG. 18E, a phase compensation layer PSC may be formed by patterning the phase compensation layer-material layer PSCm by using the patterned connection line CWL as a mask. That is, the patterned connection line CWL may function as a hard mask. In this case, an etching process may be used for patterning, for example, dry etching or wet etching may be used.

Figure 18F:
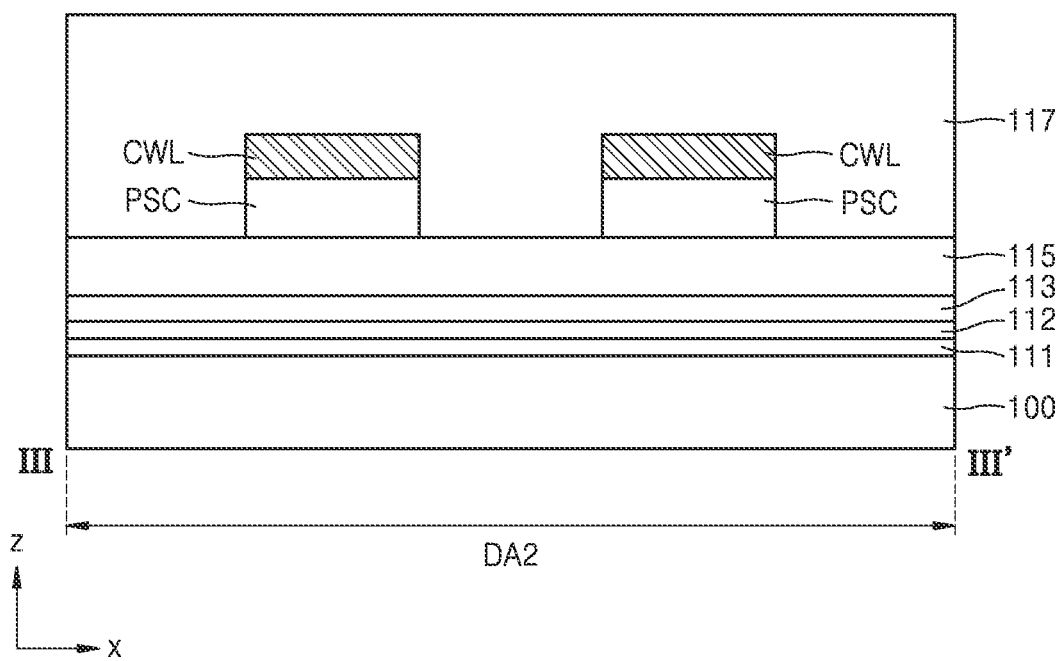

Next, referring to FIG. 18F, a first organic insulating layer 117 may be formed over the interlayer insulating layer 115 to cover the phase compensation layer PSC and the connection line CWL.

As such, because the connection line CWL may be formed by using a photoresist pattern layer PR as a mask and the phase compensation layer PSC overlapping the connection line CWL may be formed by using the connection line CWL which is patterned as a mask, misalignment between the connection line CWL and the phase compensation layer PSC may be minimized and thus the phase compensation effect thereof may be maximized. Also, both the connection line CWL and the phase compensation layer PSC may be formed without addition of a mask process.

According to an embodiment made as described above, an image may be displayed even in a second display area where an electronic component is arranged, and because a pixel circuit is not arranged in the second display area, a wider transmission area may be secured and thus the transmittance in the second display area may be improved. Also, by arranging a phase compensation layer in the second display area, the performance degradation of the electronic component due to a connection line of the second display area may be prevented. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus including a first display area, a second display area including a transmission area, and a peripheral area surrounding the first display area and the second display area, the display apparatus comprising:
    a first light emitting device arranged in the first display area;
    a first pixel circuit electrically connected to the first light emitting device;
    a second light emitting device arranged in the second display area;
    a second pixel circuit arranged in the peripheral area and electrically connected to the second light emitting device;
    an organic insulating layer arranged between the second light emitting device and the second pixel circuit;
    a connection line electrically connecting the second light emitting device to the second pixel circuit, and at least partially arranged in the second display area; and
    a phase compensation layer arranged in the second display area to overlap the connection line in a plan view,
    wherein a refractive index of the phase compensation layer is lower than a refractive index of the organic insulating layer, and
    wherein the connection line and the phase compensation layer have a same shape in a plan view.

2. The display apparatus of claim 1, wherein the phase compensation layer is disposed under the connection line.

3. The display apparatus of claim 1, wherein the phase compensation layer is disposed over the connection line.

4. The display apparatus of claim 1, wherein the phase compensation layer includes:
    a lower phase compensation layer disposed under the connection line; and
    an upper phase compensation layer disposed over the connection line.

5. The display apparatus of claim 1, wherein the connection line includes a first connection line and a second connection line arranged on different layers with the organic insulating layer disposed therebetween, and
    wherein the phase compensation layer includes a first phase compensation layer overlapping the first connection line and a second phase compensation layer overlapping the second connection line.

6. The display apparatus of claim 1, further comprising an inorganic insulating layer covering the connection line and the phase compensation layer.

7. The display apparatus of claim 1, further comprising an inorganic insulating layer arranged between the connection line and the phase compensation layer.

8. The display apparatus of claim 1, wherein a refractive index of the connection line is higher than the refractive index of the organic insulating layer.

9. The display apparatus of claim 1, wherein the connection line includes a transparent conductive oxide.

10. The display apparatus of claim 1, wherein the organic insulating layer includes a photosensitive polyimide or a siloxane-based organic material.

11. The display apparatus of claim 1, wherein the phase compensation layer includes an inorganic insulating material.

12. The display apparatus of claim 11, wherein the phase compensation layer includes at least one of silicon oxide (SiO2), silicon oxynitride (SiON), and silicon carbonitride (SiCN).

13. The display apparatus of claim 1, wherein a thickness of the phase compensation layer is provided such that a light passing through an area of the second display area in which the connection line is arranged and a light passing through an area in which the connection line is not arranged have a same phase.

14. A display apparatus including a first display area, a second display area including a transmission area, an intermediate area disposed between the first display area and the second display area, and a peripheral area surrounding the first display area, the display apparatus comprising:
    a first light emitting device arranged in the first display area;
    a first pixel circuit electrically connected to the first light emitting device;
    a second light emitting device arranged in the second display area;
    a second pixel circuit arranged in the intermediate area and electrically connected to the second light emitting device;
    an organic insulating layer arranged between the second light emitting device and the second pixel circuit;
    a connection line electrically connecting the second light emitting device to the second pixel circuit and at least partially arranged in the second display area; and
    a phase compensation layer arranged in the second display area to overlap the connection line in a plan view,
    wherein a refractive index of the phase compensation layer is lower than a refractive index of the organic insulating layer, and wherein the connection line and the phase compensation layer have a same shape in a plan view.

\* \* \* \* \*